United States Patent [19]
Yamamoto et al.

[11] Patent Number: 5,138,364
[45] Date of Patent: Aug. 11, 1992

[54] RECORDING SYSTEM

[75] Inventors: Takemi Yamamoto; Jun Sakai; Takehiko Murata, all of Nagoya, Japan

[73] Assignee: Brother Kogyo Kabushiki Kaisha, Aichi, Japan

[21] Appl. No.: 451,238

[22] Filed: Dec. 15, 1989

[30] Foreign Application Priority Data

Dec. 19, 1988 [JP] Japan ................................ 63-320242
Dec. 19, 1988 [JP] Japan ................................ 63-320244
Jan. 31, 1989 [JP] Japan ................................ 1-22193

[51] Int. Cl.$^5$ ............................................. G03B 27/32
[52] U.S. Cl. ....................................................... 355/27
[58] Field of Search ..................... 355/27, 28, 100, 32; 430/138

[56] References Cited

U.S. PATENT DOCUMENTS

| | | | |
|---|---|---|---|
| 4,825,256 | 4/1989 | Nakai et al. | 355/27 |
| 4,841,338 | 6/1989 | Suzuki | 355/100 |
| 4,865,943 | 9/1989 | Wright | 430/138 |

Primary Examiner—L. T. Hix
Assistant Examiner—Khanh Dang
Attorney, Agent, or Firm—Oliff & Berridge

[57] ABSTRACT

A recording system for recording visible images on a recording medium according to source image information, including a coating device applying to the medium at least one kind of image-recording toner including a photosensitive toner, and an exposing device imagewise exposing the medium having thereon the photosensitive toner, to a radiation having the source image information so as to form on the medium images representing the source image information. The coating device may apply to the medium at least one of the photosensitive microcapsules and developer material which serve as the at least one kind of toner, according to the source image information, and the exposing device may expose to the radiation the medium having the microcapsules serving as the photosensitive toner so as to form microcapsule-based latent images. The recording system may further includes an electrostatic body, and a switching device selectively permitting the exposure of the medium having thereon the photosensitive toner, and exposure to the radiation of the electrostatic body for forming electrostatic latent images according to which the at least one kind of toner is adhered thereto. The switching device may selectively permit the exposure of the electrostatic body for forming the electrostatic latent images, and exposure to the radiation of the photosensitive toner adhered to the electrostatic body.

19 Claims, 6 Drawing Sheets

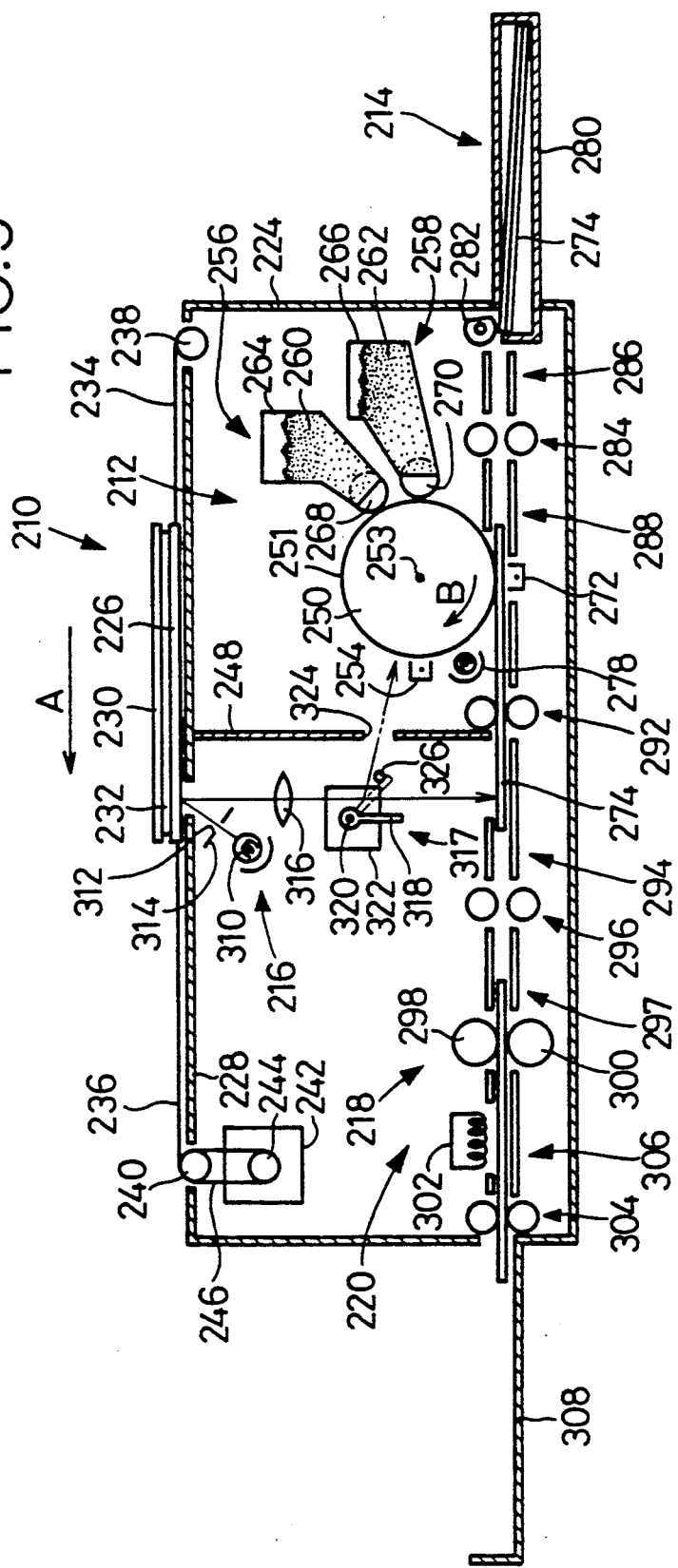

RECORDING SYSTEM

BACKGROUND OF THE INVENTION

1. Field of the Invention

The present invention relates to a recording system for image-wise exposing a photosensitive toner to a radiation having source image information such as original images, and recording visible images on a recording medium by utilizing the image-wise exposed toner.

2. Discussion of the Prior Art

The present application relates to U.S. Pat. application No. 07/159,736, the Assignee of which is the Assignee of the present application and which issued as U.S. Pat. No. 4,943,509.

The above related application discloses a recording apparatus including (a) an exposing device for image-wise exposing photosensitive microcapsules to a radiation having source image information, so as to form thereon latent images representing the source image information, (b) a coating device for applying a developer material to a recording medium, and (c) a developing device for applying a pressure to the image-wise exposed microcapsules so as to cause a chemical reaction with the developer material, to thereby develop the latent images into visible images on the recording medium. The related application also discloses a recording apparatus including (1) a coating device for applying photosensitive microcapsules and a developer material to a recording medium, (2) an exposing device for image-wise exposing the microcapsules to a radiation having source image information, so as to form thereon latent images representing the source image information, and (3) a developing device for applying a pressure to the image-wise exposed microcapsules so as to cause a chemical reaction with the developer material, to thereby develop the latent images into visible images on the recording medium. Both the microcapsules and the developer material used in these apparatus are image-recording toners, and the microcapsules, in particular, is a photosensitive toner whose characteristics are changeable upon exposure to a radiation. As one of photosensitive toners there is known another type of a toner which produces a color upon exposure to a radiation without any developer material.

However, the above-indicated recording apparatus are not satisfactory in that the developer material, or both the developer material and the microcapsules, is/are applied to the entire surface of a recording medium such as an ordinary cut sheet. Since the material or materials is/are applied to areas on the recording medium where no image is recorded, more than the actually needed material or materials is consumed.

SUMMARY OF THE INVENTION

It is therefore an object of the present invention to provide a recording system which records visible images on a recording medium according to source image information by applying at least one of photosensitive microcapsules and a developer material to the recording medium according to the source image information and image-wise exposing the microcapsules on the recording medium to a radiation having the source image information.

According to a first aspect of the present invention, there is provided a recording system for recording visible images on a recording medium according to source image information, comprising (a) a coating device applying to the recording medium a first coating material including microcapsules each of which contains a chromogenic material and a photosensitive material whose hardness is changeable upon exposure to a radiation, and a second coating material including a developer material, the coating device applying at least one of the first and second coating materials to the recording medium according to the source image information, (b) an exposing device image-wise exposing the recording medium having thereon the first coating material, to a radiation having the source image information, so as to change degrees of hardness of the microcapsules according to the source image information and thereby form on the recording medium microcapsule-based latent images representing the source image information, and (c) a developing device applying a pressure to the image-wise exposed recording medium so as to rupture the microcapsules depending upon the degrees of hardness thereof and thereby cause a chemical reaction of the chromogenic material coming out of the ruptured microcapsules with the developer material, whereby the microcapsule-based latent images are developed into the visible images on the recording medium.

In the recording system constructed as described above, the coating device applies at least one of the first and second coating materials to a recording medium according to the source image information. Accordingly, the present recording system is capable of reducing the amount of consumption of the at least one coating material, in contrast to the conventional apparatus in which a developer material, or both the developer material and microcapsules, is/are applied to the entire surface of a recording medium. Consequently the cost of recording is reduced. According to the principle of the first aspect of the invention, the at least one coating material applied to the recording medium according to the source image information, may be both the first and second coating materials, or alternatively one of the two coating materials. In the latter case the other coating material may be applied to an entire surface of the recording medium. Meanwhile, the photosensitive material contained in each microcapsule may be of the type which is cured or hardened upon exposure to a radiation, or alternatively of the type which is softened upon the exposure. The recording system may be, for example, a copying machine for producing a copy of an image original by recording the original images on a copy sheet, or other kinds of printing machines for printing images on a sheet according to image information data. The recording medium on which visible images are reproduced may be a cloth.

In a preferred embodiment according to the first aspect of the present invention, the coating device includes an electrostatic body having an electrically chargeable surface, the electrically chargeable surface permitting electrostatic latent images to be formed therein according to the source image information, coating means for applying the at least one of the first and second coating materials to the electrically chargeable surface of the electrostatic body according to the electrostatic latent images, and transferring means for transferring the at least one coating material from the electrically chargeable surface to the recording medium. The first and second coating materials may be applied to the electrostatic body such that one of the two coating materials is applied thereto according to the electrostatic latent images, while the other coating material is uniformly applied thereto independent of the electrostatic latent images.

In an advantageous form of the above-indicated embodiment of the present invention, the recording system further comprises a charging device uniformly charging the electrically chargeable surface of the electrostatic body and, in addition to the exposing device as a first exposing device, a second exposing device exposing the uniformly charged surface of the electrostatic body to the radiation having the source image information, so as to form therein the electrostatic latent images.

According to a feature of the above-indicated form of the present invention, the electrostatic body consists of a drum which is rotatable about an axis, the second exposing device exposing an exposure zone extending with a predetermined width in parallel to the drum axis on an electrically chargeable circumferential surface of the drum as the drum is rotated about the axis, so that the electrostatic latent images are formed in the circumferential surface of the drum.

According to another feature of the above-indicated form of the present invention, the coating means of the coating device includes a first coating means for applying the first coating material to the electrostatic body according to the electrostatic latent images, and a second coating means for applying the second coating material to the electrostatic body according to the electrostatic latent images, the coating device further including control means for controlling the electrostatic body, the first and second coating means, and the transferring means such that first the second coating material is applied to the electrostatic body, then transferred from the electrostatic body to the recording medium, subsequently the first coating material is applied to the electrostatic body, and then transferred from the electrostatic body to the recording medium. However, the control means may be adapted to control the electrostatic body, the first and second coating means and the transferring means such that the first coating material is applied to the electrostatic body and transferred from the electrostatic body to the recording medium before the second material is applied and transferred. In addition, the control means may be adapted to control those elements such that the first and second materials are superposed on each other on the electrostatic body and then the superposed materials are transferred in double layers from the electrostatic body to the recording medium. This is advantageous because the number of the transferring operations is reduced and the time required for producing a copy is decreased. However, if the second coating material (or developer material included therein) is opaque and does not permit light or radiation, it is required that the second material be placed under the first coating material on the recording medium. In the event that the first coating material is applied to the entire surface of the recording medium, the application of the first coating material may be conducted at any time before the exposure of the recording medium for forming the microcapsule-based latent images. Meanwhile, in the event that the second coating material is applied to the entire surface of the recording medium, the application of the second coating material may be conducted at any time before or after the application of the pressure to the recording medium. Thus, it is not required that the first and second coating materials be superposed on each other on the recording medium without any dislocation therebetween, unlike when each of the first and second coating materials is applied to the recording medium according to the source image information. In other words, the coating operations of the first and second coating materials are easily controlled and clear images are recorded on the recording medium. The opaque second coating material may be applied to the entire surface of the recording medium such that the second coating material entirely covers the first coating material on the recording medium, if the application of the second coating material is conducted after the exposure of the recording medium having thereon the first coating material. Furthermore, the first and second coating materials may be mixed with each other, and the mixed materials may be applied to the electrostatic body according to the electrostatic latent images. This is advantageous because the number of the formations of the electrostatic latent images on the electrostatic body is reduced to one and accordingly the copying time per copy is reduced. This manner provides another advantage that, since it is not necessary to precisely superpose the first and second coating materials on each other on the recording medium, the coating operations of the two coating materials are easily controlled.

According to yet another feature of the above-indicated form of the present invention, the first and second exposing devices include a common light source. In other words, the exposure of the electrostatic body for forming the electrostatic latent images, and the exposure of the first coating material (or microcapsules included therein) on the recording medium for forming the microcapsule-based latent images, are performed with the common light source. Accordingly, the recording system is simplified in construction. The first and second exposing devices may include displacing means for displacing an image original bearing the source image information, and as the original is displaced by the displacing means the common light source may irradiate an irradiation zone on the original which irradiation zone extends with a predetermined width perpendicularly to a direction of the displacement of the original. The first and second exposing devices may further include switching means which is selectively placed in a first position thereof in which the switching means permits the exposure of the recording medium having thereon the first coating material, and in a second position thereof in which the switching means permits the exposure of the electrostatic body. The switching means may be adapted to selectively change the direction of the light reflected by the original toward the electrostatic body and the recording medium.

In another embodiment according to the first aspect of the present invention, the microcapsules include plural sorts of capsules corresponding to a plurality of colors, the visible images being recorded in the colors on the recording medium. The recorded color images may be observed to have, in addition to the colors associated with the capsules, intermediate colors thereof.

It is another object of the present invention to provide a recording system which records visible images on a recording medium according to source image information by applying at least one kind of image-recording toner including a photosensitive toner to the recording medium according to the source image information and image-wise exposing the photosensitive toner on the recording medium to a radiation having the source image information, and which system is simplified in construction.

According to a second aspect of the present invention, there is provided a recording system for recording visible images on a recording medium according to source image information, including a coating device applying to the recording medium at least one kind of image-recording toner including a photosensitive toner, and an exposing device image-wise exposing the recording medium having thereon the photosensitive toner, to a radiation having the source image information, so as to form on the recording medium image representing the source image information, wherein the improvement comprises that the coating device includes (a) an electrostatic body having an electrically chargeable surface, (b) charging means for uniformly charging the electrically chargeable surface of the electrostatic body, (c) switching means which is selectively placed in a first position in which the switching means permits the exposure of the recording medium, and in a second position thereof in which the switching means permits exposure to the radiation of the uniformly charged surface of the electrostatic body, for forming therein electrostatic latent images representing the source image information, (d) coating means for applying to the electrostatic body at least one of the at least one kind of image-recording toner according to the electrostatic latent images, and (e) transferring means for transferring the at least one of the at least one kind of image-recording toner from the electrostatic body to the recording medium.

In the above-indicated recording apparatus, the at least one kind of image-recording toner may consist of a photosensitive toner of the type which produces a color upon exposure to a radiation without any developer material, and the photosensitive toner may be applied by the coating means to the electrostatic body according to the electrostatic latent images. Meanwhile, the at least one kind of image-recording toner may consist of photosensitive microcapsules and a developer material. In this case both of the two materials serve as image-recording toners, and the microcapsules serve as a photosensitive toner. At least one of the two materials is applied to the recording medium according to the source image information. The amount of consumption of the at least one image-recording toner applied to the recording medium according to the source image information, is reduced as compared with when the toner is applied to an entire surface of the recording medium. Furthermore, in the instant recording system, the exposure of the electrostatic body for forming the electrostatic latent images, and the exposure of the photosensitive toner on the recording medium for forming the microcapsule-based latent images, are performed by the single exposing device. Accordingly, the recording system is simplified in construction.

In a preferred embodiment according to the second aspect of the present invention, the at least one kind of image-recording toner comprise a first toner consisting of microcapsules each of which contains a chromogenic material and a photosensitive material whose hardness is changeable upon exposure to a radiation, and a second toner consisting of a developer material, the exposing device exposing to the radiation the recording medium having thereon the first toner, so as to change degrees of hardness of the microcapsules according to the source image information and thereby form on the recording medium microcapsule-based latent images representing the source image information, the recording system further comprising a developing device applying a pressure to the image-wise exposed recording medium so as to rupture the microcapsules depending upon the degrees of hardness thereof, and thereby cause a chemical reaction of the chromogenic material coming out of the ruptured microcapsules with the developer material, so that the microcapsule-based latent images are developed into the visible images on the recording medium.

In an advantageous form of the above-indicated embodiment of the present invention, the switching means includes a reflector mirror which is rotatable about an axis, a drive means for rotating the reflector mirror about its axis between a first and a second angular position thereof, and thereby selectively place the switching means in the first and second positions thereof, respectively.

In another form of the above-indicated embodiment of the present invention, the exposing device includes displacing means for displacing an image original bearing the source image information, and a light source irradiating an irradiation zone on the original which irradiation zone extends with a predetermined width perpendicularly to a direction of the displacement of the original, as the original is displaced by the displacing means, the switching means selectively directing the light reflected by the original toward the recording medium having thereon the first toner, and the electrostatic body.

It is yet another object of the present invention to provide a recording system which records visible images on a recording medium according to source image information by applying photosensitive microcapsules to an electrostatic body according to the source image information, image-wise exposing the microcapsules on the electrostatic body to a radiation having the source image information, and which is simplified in construction.

According to a third aspect of the present invention, there is provided a recording system for recording visible images on a recording medium according to source image information, comprising (a) an electrostatic body having an electrically chargeable surface, (b) a charging device uniformly charging the electrically chargeable surface of the electrostatic body, (c) an exposing device image-wise exposing the uniformly charged surface of the electrostatic body, to a radiation having the source image information, so as to form on said electrostatic body electrostatic latent images representing the source image information, (d) a coating device applying to the electrostatic body a coating material including microcapsules each of which contains a chromogenic material and a photosensitive material whose hardness is changeable upon exposure to a radiation, according to the electrostatic latent images, (e) the exposing device exposing to the radiation the electrostatic body having thereon the coating material so as to change degrees of hardness of the microcapsules according to the source image information and thereby form on the electrostatic body microcapsule-based latent images representing the source image information, and (f) a developing device applying a pressure to the microcapsule-based latent images on the recording medium so as to rupture the microcapsules depending upon the degrees of hardness thereof, and thereby cause a chemical reaction of the chromogenic material coming out of the ruptured microcapsules with a developer material, whereby the microcapsule-based latent images are developed into the visible images on the recording medium.

In the recording system constructed as described above, it is required that the application of the pressure to the microcapsules be conducted with the microcapsules being in contact with the recording medium, since the chromogenic material comes out of the microcapsules if the microcapsules are ruptured under the pressure. However, if the microcapsules are placed under the pressure on the recording medium such that the chromogenic material coming out of the ruptured microcapsules contacts the developer material on the recording medium, any kind of recording medium may be used as the recording medium. In addition, the present recording system provides another advantage that, since the coating material is exposed on the electrostatic body to the radiation having the source image information, it is no longer required to expose the recording medium to the radiation. In other words, the exposure of the electrostatic body for forming the electrostatic latent images and the exposure of the coating material (or microcapsules included therein) for forming the microcapsule-based latent images, are performed on the electrostatic body by the single exposing device. Thus, the present recording system is simplified in construction. Furthermore, the coating material is locally applied to areas on the electrostatic body, namely, applied thereto according to the electrostatic latent images, the amount of consumption of the coating material is reduced as compared with when the coating material is applied to all the areas on the electrostatic body. Thus the cost of recording is decreased.

In an advantageous embodiment according to the third aspect of the present invention, the developing device includes a presser member which cooperates with the electrostatic body to apply the pressure to the microcapsule-based latent images on the recording medium, the recording system further comprising a control device controlling the exposing device, the coating device and the developing device, such that first the coating material is applied to the electrostatic body according to the electrostatic latent images, subsequently the electrostatic body having thereon the coating material is exposed to the radiation so as to form the microcapsule-based latent images, and then the microcapsule-based latent images are developed into the visible images. However, the application of the pressure to the microcapsule-based latent images on the recording medium may be conducted after the microcapsules have been transferred from the electrostatic body to the recording medium.

In a preferred form of the above-indicated advantageous embodiment of the present invention, the recording system further comprises, in addition to the coating device as a first coating device, a second coating device for applying, in addition to the coating material as a first coating material, a second coating material including the developer material to the electrostatic body according to the source image information. The control device may control the second coating device such that, simultaneously with the formation of the microcapsule-based latent images on the electrostatic body, electrostatic latent images are formed on the electrostatic body according to the source image information, subsequently the second coating material is applied to the electrostatic body according to the thus formed electrostatic latent images, and then the microcapsule-based latent images are developed into the visible images. However, the second coating material may be contacted, in other manners, with the chromogenic material coming out of the ruptured microcapsules. For example, the formation of the electrostatic latent images according to which the second coating material is applied to the electrostatic body, may be conducted independent of the formation of the microcapsule-based latent images. This is carried out, for example, by uniformly charging the electrostatic body and applying the second coating material to all the areas on the electrostatic body, after the application of the first coating material to the electrostatic body and the exposure of the first coating material on the electrostatic body. The application of the second coating material to the electrostatic body may be conducted at any time before or after the application and exposure of the first coating material. Since in these cases it is not required that the second coating material be superposed on the first coating material on the electrostatic body without any dislocation therebetween, the coating operations of the first and second coating materials are easily controlled and clear images are recorded on the recording medium. Meanwhile, in the event that the second coating material is opaque it is required that the second coating material be placed under the first coating material, or superposed on the first coating material after the exposure of the first coating material. Furthermore, the first and second coating materials may be mixed with each other, and the mixed materials may be applied to the electrostatic body according to the electrostatic latent images and subsequently exposed to the radiation having the source image information. Thus, the coating device is simplified in construction. Moreover, the superposed second and first coating materials on the electrostatic body may be transferred to the recording medium and then the recording medium having thereon the two coating materials may be pressed by the developing device. The first and second coating materials may be transferred one by one following the application of each material to the electrostatic body. It is a third option that the first coating material is transferred from the electrostatic body to the recording medium, while the second coating material is directly and uniformly applied to the entire surface of the recording medium. The application of the second coating material may be conducted at any time before or after the transfer of the first coating material to the recording medium, or before or after the application of the pressure to the recording medium having thereon the first coating material.

BRIEF DESCRIPTION OF THE DRAWINGS

The above and optional objects, features and advantages of the present invention will be better understood by reading the following detailed description of the presently preferred embodiments of the invention, when considered in conjunction with the accompanying drawings, in which:

FIG. 3 is a schematic view of another embodiment of the present invention;

DETAILED DESCRIPTION OF THE PREFERRED EMBODIMENTS

Figure 1:
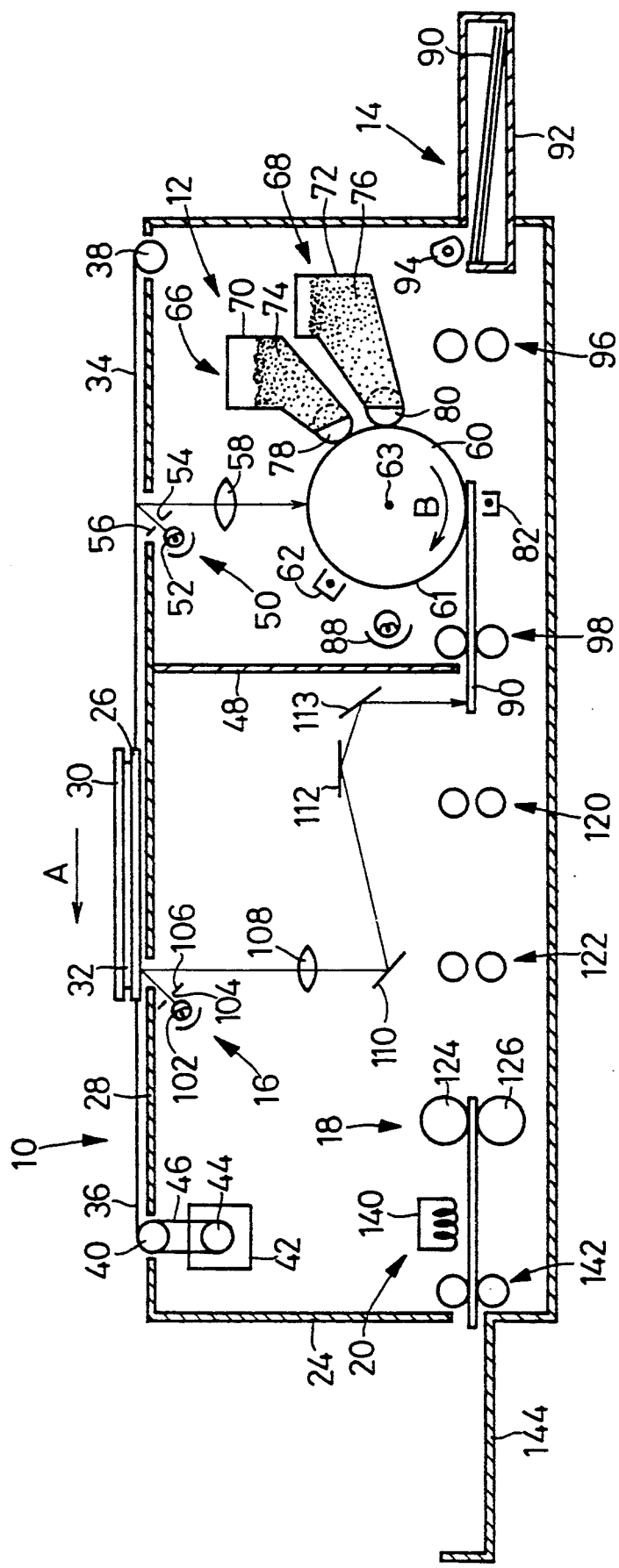
FIG. 1 is a schematic view of a copying machine embodying the present invention.

Referring first to FIG. 1, there is illustrated a copying machine embodying the present invention. The copying machine includes an original displacing device 10, a coating device 12, a sheet feeding device 14, an exposing device 16, a developing device 18, and a fixing device 20.

The original displacing device 10 for displacing a color-image original 32 bearing source image information or color images, is provided at the top of a housing 24 of the copying machine. The original displacing device 10 includes a support 26 on which the original 32 is set. The support 26 is formed of a colorless transparent material, such as glass, which transmits light or radiation. The support 26 is disposed on a top wall 28 of the housing 24 such that the support 26 is displaceable in rightward and leftward directions as viewed in FIG. 1. The original displacing device 10 further includes a cover 30 for covering the original 32 set on the support 26. Wires 34, 36 are connected at their one end to the right-hand and left-hand ends of the support 26, respectively, and are wound at their other end around pulleys 38, 40, respectively. The pulleys 38, 40 are rotatably supported by the housing 24. The pulley 40 is located on the downstream side of the pulley 38 as viewed in the leftward direction indicated at A in FIG. 1. Hereinafter the direction "A" is referred to as the "copying" direction, and a direction opposite to the direction "A" is referred to as the "reverse" direction. The pulley 40 is coupled via a belt 46 to a pulley 44 secured to an output shaft of a drive motor 42. The drive motor 42 drives or rotates the pulley 40 and thereby displaces the support 26 in the copying direction. Meanwhile, the pulley 38 is biased by a biasing device (not shown) to rotate in a direction causing taking-up of the wire 34 and thereby displacing the support 26 in the reverse direction opposite to the copying direction. Accordingly, when the drive motor 42 is rotated in a direction opposite to the direction causing the displacement of the support 26 in the copying direction, the support 26 is returned in the reverse direction toward its start position where the displacement of the support 26 in the copying direction commences.

Space inside the housing 24 is separated by a partition wall 48 into an upstream-side section and a downstream-side section as viewed in the copying direction. The coating device 12 is provided in the upstream-side section. The coating device 12 includes an exposing means 50 including a lamp 52 serving as a light source. The lamp 52 has an elongate shape, and its longitudinal axis extends in a transverse direction perpendicular to the copying direction. The lamp 52 irradiates an irradiation zone on an imaged surface of the original 32 through a slit 54 formed through a screen 56 provided in front of the lamp 52. The original color images have a color or colors different from the background or base color, namely, color of the paper of the original 32. The slit 54 has a predetermined width, and extends in parallel to the longitudinal axis of the lamp 52. Thus, the irradiation zone irradiated by the lamp 52 has a suitable width, and extends in a transverse direction perpendicular to the copying direction. The light beams or images reflected from the original 32 are converged by a lens 58 on an outer circumferential surface 61 of a photosensitive drum 60 serving as an electrostatic body. The drum 60 is disposed directly beneath the lens 58. Thus, the exposing means 50 exposes an exposure zone at the top of the outer surface 61 of the drum 60 as the drum 60 is rotated about its axis 63. The exposure zone has a suitable width, and extends in parallel to the rotation axis 63 of the drum 60. The lens 58 vertically and laterally reverses the light beams or images reflected from the original 32. The photosensitive drum 60 is prepared by applying selenium by vapor deposition to the surfaces of a cylindrical member formed of a metallic conductor material such as aluminum or copper. The drum 60 is rotated about the axis 63 clockwise as viewed in FIG. 1 at a peripheral speed equal to a speed of the displacement of the support 26. A corotron 62 is disposed adjacent to the drum surface 61 at a location prior to the top of the drum 60, namely the exposure zone, as viewed in a rotating direction B of the drum 60. The corotron 62 uniformly electrostatically charges the drum surface 61. As the drum 60 is rotated, the leading area of the uniformly charged portion of the drum surface 61 comes to the top of the drum 60 and is exposed in the exposure zone to the light beams or images reflected from the original 32 which concurrently is displaced in the copying direction. Upon exposure to the reflected light beams or images the uniformly charged drum surface 61 is locally discharged through the underlying conductor material, and locally not discharged, depending upon the intensities of the light beams or images. Thus, the drum surface 61 is imagewise exposed according to the source image information or images on the original 32, so that electrostatic latent images corresponding to the original images are formed in the drum surface 61.

The coating device 12 also includes a developer-material coating means 66 and a microcapsules coating means 68 which are disposed adjacent to the drum surface 61 at respective locations of this order following the exposure zone as viewed in the rotating direction B of the drum 60. The developer-material coating means 66 applies a developer material 74 to the drum surface 61, while the microcapsules coating means 68 applies photosensitive microcapsules 76 to the drum surface 61. The coating means 66, 68 include feeders 70, 72 for feeding the developer material 74 and the microcapsules 76, respectively. Each of the microcapsules 76 contains a radiation-curable resin which is cured upon exposure to a radiation, a chromogenic material or color precursor, a polymerization initiator, etc. The developer material 74 chemically reacts with the chromogenic material coming out of each microcapsule to develop a color. The microcapsules 76 include three kinds of capsules corresponding to three colors. Thus, a color copy of the color-image original 32 can be produced. More specifically, the microcapsules 76 include capsules C which are cured upon exposure to red light, capsules M which are cured upon exposure to green light, and capsules Y which are cured upon exposure to blue light. Each capsule C, M, Y is cured, or not cured, upon exposure to light depending upon the color and intensity of the light. Thus, microcapsule-based latent images corresponding to the color images on the original 32 can be formed on the microcapsules 76. The microcapsules 76 constituting the microcapsule-based latent images are ruptured, or not ruptured, depending upon the degrees of hardness thereof, so that the microcapsule-based latent images are developed into color images. These color images have the same colors and tones as those of the original color images. The developer-material and microcapsules feeders 70, 72 have rollers 78, 80, respectively, each of which is rotatable counterclockwise about an axis parallel to the rotation axis 63 of the drum 60. The developer material 74 and the microcapsules 76 are applied to the drum surface 61 as the rollers 78, 80 are rotated, respectively. The materials 74, 76 are electrically charged by a charging device (not shown) with a sign (positive or negative) opposite to a sign (negative or positive) of the drum surface 61. Each material 74, 76 is adhered to the drum surface 61 by electrostatic attraction or Coulomb's attraction according to the electrostatic latent images.

A corotron 82 is disposed adjacent to the drum surface 61 at a location diametrically opposite to the exposure zone directly below the lens 58. The corotron 82 electrically charges a recording medium in the form of a copy sheet 90 with a sign opposite to the sign of the developer material and microcapsules 74, 76. This permits the developer material 74 or microcapsules 76 to be easily transferred from the drum surface 61 to the copy sheet 90. Thus, each material 74, 76 is applied to the copy sheet 90 according to the source image information or images on the original 32. A discharger 88 is disposed adjacent to the drum surface 61 at a location between the transfer position (or the corotron 82) and the corotron 62. The discharger 88 entirely discharges the drum surface 61 through the underlying conductor material.

The sheet feeding device 14 for feeding the copy sheet 90, is provided at the right-hand bottom of the housing 24 as viewed in FIG. 1. An ordinary cut sheet is used as the copy sheet 90. The sheet feeding device 14 includes a case 92 for storing a stack of copy sheets 90, and a roller 94 for feeding out the copy sheets 90 one by one. The copy sheet 90 fed out of the case 92 is subsequently conveyed by a pair of rollers 96, 96 to the transfer position between the drum 60 and the corotron 82. The rollers 96, 96 are rotated by a drive motor (not shown) at a peripheral speed equal to the peripheral speed of the drum 60 and the displacement speed of the support 26.

The copy sheet 90 having thereon the transferred developer material and microcapsules 74, 76, are further fed by another pair of rollers 98, 98 toward the exposing device 16. The exposing device 16 is provided on the downstream side of the partition wall 48 as viewed in the copying direction. The exposing device 16 includes a lamp 102 serving as a light source. The lamp 102 has a configuration similar to the lamp 52 of the exposing means 50 of the coating device 12. The lamp 102 has an elongate shape, and its longitudinal axis extends normally to the copying direction. The exposing device 16 further includes a screen 106 which is provided in front of the lamp 102 and has an elongate slit 104 formed therethrough with a predetermined width. Thus, the exposing device 16 irradiates an irradiation zone on the imaged surface of the original 32 such that the irradiation zone has a suitable width and extends normally to the copying direction. This irradiation zone is different, and apart, from the irradiation zone irradiated by the lamp 52 of the exposing means 50 of the coating device 12. The light beams or images reflected from the original 32 are converged by a lens 108, and the direction of the converged light beams is changed by a first, a second and a third reflection mirror 110, 112, 114 one after another, so that the reflected light beams are incident to the copy sheet 90 at a position (hereinafter referred to as the exposing position) apart by a predetermined distance from the irradiation zone (irradiated by the lamp 102) in the reverse direction. The reason why the irradiation zone and the exposing position are spaced apart from each other by the predetermined distance will be described later. The lens 108 laterally and vertically reverses the light beams or images reflected from the original 32, like the lens 58. Thus, the copy sheet 90 having thereon the microcapsules 76 is image-wise exposed according to the source image information or color images on the original 32, so that microcapsule-based latent images are formed on the copy sheet 90.

The exposed copy sheet 90 is further fed by two pairs of rollers 120, 120 and 122, 122 to the developing device 18. The developing device 18 includes a pair of presser rollers 124, 126 which provide a nip for applying a pressure to the copy sheet 90 as the copy sheet 90 is fed therebetween. The presser rollers 124, 126 are rotated together with the rollers 124, 124, 126, 126 at a peripheral speed equal to that of the rollers 96, 96, by the previously-described drive motor associated with the rollers 96, 96. After the application of the developing pressure to the copy sheet 90, the copy sheet 90 is fed to the fixing device 20. The fixing device 20 includes a heater 140 for heating the copy sheet 90 for fixation. After the fixation the copy sheet 90 is fed by a pair of rollers 142, 142 into a receiving tray 114 where the operator or user takes the copy sheet 90 as a copy of the original 32.

There will be described the operation of the copying machine constructed as described above.

At the start of a copying operation, the support 26 is at its start position, and the irradiation zone irradiated by the exposing means 50 of the coating device 12 is located on the downstream-side end of the support 26 as viewed in the copying direction. First, an original 32 bearing source image information or color images is set on the support 26, and the cover 30 is put over the original 32. Upon operation of a start switch (not shown), the photosensitive drum 60 is rotated, and the drum surface 61 is uniformly charged by the corotron 60. When the leading area of the uniformly charged portion of the drum surface 61 comes to the top of the drum 60 directly below the lens 58, the displacement of the support 26 in the copying direction commences, and the lamp 52 irradiates the irradiation zone on the original 32 which concurrently is displaced in the copying direction. The light beams or images reflected from the original 32 expose the exposure zone on the drum surface 61 at the top of the drum 60 as the drum 60 is rotated, thereby image-wise exposing the drum surface 61 according to the source image information or images on the original 32. Thus, electrostatic latent images are formed in the drum surface 61. Since the displacement speed of the support 26 and the peripheral speed of the drum 60 are equal to each other, the electrostatic latent images formed in the drum surface 61 are free from deformation or distortion as compared with the original images. This is a first exposure of the drum surface 61. At the beginning of this first exposure the developer-material coating means 66 is placed in its operative mode, while the microcapsules coating means 68 remains in its inoperative mode. The developer-material coating means 66 is operated to apply the developer material 74 to the drum surface 61 according to the electrostatic latent images, namely, the original images. Thus, the developer material 74 applied or adhered to the drum surface 61 provides the developer-material images corresponding to the original images.

The thus formed developer-material images are transferred from the drum surface 61 to a copy sheet 90 at the transfer position where the corotron 82 is disposed. The copy sheet 90 is fed from the case 92 to the transfer position such that, when the leading area of the exposed portion of the drum surface 61 (this area is also the leading area of the uniformly charged portion) comes to the transfer position, the downstream-side end of the copy sheet 90 as viewed in the copying direction just comes to the transfer position. Thus, the developer-material images are transferred from the drum surface 61 to the copy sheet 90 as the drum 60 and the copy sheet 90 are rotated and fed at the same speeds, respectively.

After the electrostatic latent images have been formed in the drum surface 61 according to the whole source image information on the original 32, the support 26 is returned in the reverse direction to its start position. In addition, after the developer-material images have been transferred at the transfer position from the drum surface 61 to the copy sheet 90, the drum surface 61 is discharged by the discharger 88 as the drum 60 is rotated. Unless the drum surface 61 is discharged, the electrostatic latent images formed by the first exposure remain in the drum surface 61 and consequently the drum surface 61 cannot uniformly be charged by the corotron 62 in the next charging operation. This will cause a significant difference between the amount of the developer material 74 adhered to the drum surface 61 and that of the microcapsules 76 adhered to the same 61. After the developer material 74 has been adhered to the drum surface 61 according to the entire electrostatic latent images and the entire developer-material images are transferred from the drum surface 61 to the copy sheet 90, the rotation of the drum 60 is stopped and the developer-material coating means 66 is placed in its inoperative position. At this point of time the upstream-side end of the copy sheet 90 is located at the transfer position. After the rotation of the drum 60 has been stopped, the copy sheet 90 is returned in the reverse direction so that the downstream-side end of the copy sheet 90 is located at a position apart by a small distance upstream from the transfer position.

Figure 2:
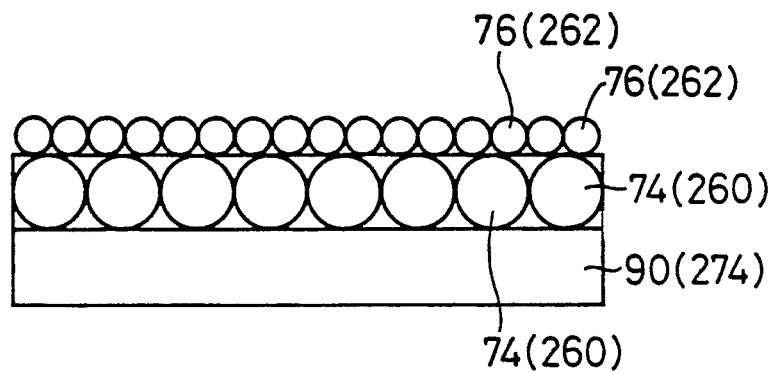
FIG. 2 is an explanatory view illustrating the developer material and the microcapsules applied in double layers to a copy sheet by a coating device of the copying machine of FIG. 1.

After the downstream-side end of the copy sheet 90 has been returned to the above-described position on the upstream side of the transfer position, the rotation of the drum 60 is re-started and the drum surface 61 is uniformly charged by the corotron 62. When the leading area of the uniformly charged portion of the drum surface 61 comes to the top of the drum 60, namely, the exposure zone, the support 26 is re-displaced from its start position in the copying direction, and the drum surface 61 is again image-wise exposed according to the source image information on the original 32. Thus, electrostatic latent images are formed in the drum surface 61. This is the second exposure of the drum surface 61. At the beginning of the second exposure the microcapsules coating means 68 is placed in its operative position. Thus, the microcapsules 76 are adhered to the drum surface 61 according to the newly formed electrostatic latent images. The microcapsule images formed on the drum surface 61 correspond to the original images. The copy sheet 90 is fed to the transfer position like at the previous time, namely, such that when the leading area of the exposed portion of the drum surface 61 comes to the transfer position the downstream-side end of the copy sheet 90 just comes to the transfer position. Thus, the microcapsules images are transferred from the drum surface 61 to the copy sheet 90 such that the microcapsules images are superposed on the developer-material images with precision, namely, without any dislocation therebetween. Thus, the developer-material images and the microcapsules images, each corresponding to the original images, are provided in double layers of this order on the copy sheet 90 as shown in FIG. 2. After the transfer of the microcapsules images to the copy sheet 90, the rotation of the drum 60 is stopped and the microcapsules coating means 68 is placed in its inoperative mode.

The displacement of the copy sheet 90 in the copying direction is further continued after the transfer of the microcapsules images. That is, the copy sheet 90 is fed toward the previously-described exposing position on the downstream side of the partition wall 48 as viewed in the copying direction. At the exposing position the copy sheet 90 is image-wise exposed by the exposing device 18 according to the source image information or color images on the original 32. Also, the displacement of the original 32 or support 26 in the copying direction is continued after the second exposure of the drum surface 61. Therefore, the original 32 and the copy sheet 90 are displaced in the copying direction while being spaced from each other by a distance equal to half the circumferential length of the drum 60. The exposing device 16 is designed such that the exposing position and the irradiation zone irradiated by the lamp 102 are apart from each other by the above-indicated distance equal to half the circumferential length of the drum 60. The direction of the light beams or images reflected from the original 32 is changed by the first, second and third mirrors 110, 112, 113, and the reflected light beams or images are incident to the copy sheet 90 at the exposing position. Thus, the microcapsule images on the copy sheet 90 are image-wise exposed according to the source image information or color images on the original 32, as if the original color images were superposed on the microcapsule images without any dislocation therebetween. As a result, microcapsule-based latent images are formed on the copy sheet 90. Although the original 32 and the copy sheet 90 are fed in the copying direction with the above-indicated distance therebetween, it is however not necessary to stop the displacement of the original 32 so as to await the copy sheet 90 to arrive at a position directly below the irradiation zone irradiated by the lamp 102. Thus, the displacements of the original 32 and the copy sheet 90 are easily controlled.

As has been described heretofore, the microcapsule images on the copy sheet 90 are exposed to the light beams or images reflected from the original 32, and the microcapsule-based latent images are formed on the copy sheet 90. More specifically, the microcapsules 76 including the three kinds of capsules C, M, Y are exposed to the light beams reflected from the original 32, and the degree of hardness of the radiation-curable resin of each capsule C, M, Y is changed depending upon the color and intensity of the light beam to which the capsule is exposed. When the copy sheet 90 is pressed by the developer device 18, the microcapsules 76 on the copy sheet 90 are ruptured, or not ruptured, according to the changed degrees of hardness thereof. As a result, the chromogenic material or color precursor coming out of each ruptured capsule chemically reacts with the developer material 74, and thereby develops a corresponding color. Thus, color images are developed on the copy sheet 90. These color images have the same colors and tones as those of the corresponding color images on the original 32. In addition, since the microcapsule images are superposed on the developer-material images on the copy sheet 90, the exposure of the microcapsule images is not interfered with although the developer material 74 is opaque and therefore does not transmit light or radiation. After the application of the developing pressure, the copy sheet 90 is heated by the fixing device 20 and then is further fed into the receiving tray 144.

As is apparent from the foregoing, in the illustrated embodiment, the coating device 12 applies the developer material 74 and the microcapsules 76 to the copy sheet 90. Therefore, any kind of recording medium may be used as the copy sheet 90 in the copying machine.

In addition, the coating device 12 applies the developer material 74 and the microcapsules 76 to the drum 60 according to the source image information or images on the original 32, and transfer the developer-material images and the microcapsule images from the drum 60 to the copy sheet 90. Therefore, the amount of use of the developer material 74 and microcapsules 76 is reduced as compared with the conventional recording machine in which the developer material, or both the developer material and the microcapsules, is/are applied to the entire surface of a recording medium. Accordingly the cost of production per copy is reduced.

Referring next to FIG. 3 there is illustrated another embodiment of the present invention. The present copying machine includes an original displacing device 210, a coating device 212, a sheet feeding device 214, an exposing device 216, a developing device 218, and a fixing device 220.

The original displacing device 210 for displacing a color-image original 232, is provided at the top of a housing 224 of the copying machine. The original displacing device 210 includes a support 226 on which the original 232 is set. The support 226 is formed of a colorless transparent material, such as glass, which transmits light or radiation. The support 226 is located on a top wall 228 of the housing 224 such that the support 226 is displaceable in rightward and leftward directions as viewed in FIG. 3. The original displacing device 210 further includes a cover 230 for covering the original 232 set on the support 226. Wires 234, 236 are connected at their one end to the right-hand and left-hand ends of the support 226, respectively, and are wound at their other end around pulleys 238, 240, respectively. The pulleys 238, 240 are rotatably supported by the housing 224. The pulley 240 is located on the downstream side of the pulley 238 as viewed in the leftward direction indicated at A in FIG. 3. Hereinafter this direction "A" is referred to as the "copying" direction, and a direction opposite to the copying direction is referred to as the "reverse" direction. The pulley 240 is coupled via a belt 246 to a pulley 244 secured to an output shaft of a drive motor 242. The drive motor 242 drives or rotates the pulley 240 and thereby displaces the support 226 in the copying direction. Meanwhile, the pulley 238 is biased by a biasing device (not shown) to rotate in a direction causing taking-up of the wire 234 and thereby displacing the support 226 in the reverse direction opposite to the copying direction. Accordingly, when the drive motor 242 is rotated in a direction opposite to the direction causing the displacement of the support 226 in the copying direction, the support 226 is returned in the reverse direction toward its start position where the displacement of the support 26 in the copying direction commences. Space inside the housing 224 is separated by a partition wall 248 into an upstream-side section and a downstream-side section as viewed in the copying direction. The start position of the support 26 is located apart by a small distance downstream from the partition wall 248 as viewed in the copying direction. The coating device 212 is provided in the upstream-side section. The coating device 212 includes an electrostatic body in the form of a photosensitive drum 250.

The drum 250 is prepared by applying selenium by vapor deposition to the surfaces of a cylindrical member formed of a metallic conductor material such as aluminum or copper. The drum 250 is rotated about its axis 253 clockwise as viewed in FIG. 3 at a peripheral speed equal to a speed of the displacement of the support 226. The exposing device 216 exposes an exposure zone on an outer circumferential surface 251 of the drum 250. The exposure zone has a suitable width and extends in parallel to the rotation axis 253 of the drum 250. The coating device 12 also includes a corotron 254 which is disposed adjacent to the drum surface 251 at a location prior to the exposure zone as viewed in a rotating direction B of the drum 250. The corotron 254 uniformly electrically charges the drum surface 251. As will be described in detail later, the uniformly charged portion of the drum surface 251 is image-wise exposed by the exposing device 216 according to source image information or images on the original 232, so that electrostatic latent images corresponding to the original images are formed in the drum surface 251. After the formation of the electrostatic latent images, a developer material 260 and microcapsules 262 are applied to the drum surface 251 by a developer-material coating means 256 and a microcapsules coating means 258, respectively, according to the electrostatic latent images. Thus, in the present embodiment, both the developer material 260 and the microcapsules 262 are applied to the drum surface 251 according to the electrostatic latent images, namely the source image information, and the coating means 256, 258 constitute means for applying to the electrostatic body at least one kind of image-recording toner according to the electrostatic latent images.

The developer-material and microcapsules coating means 256, 258 are disposed adjacent to the drum surface 251 at respective locations of this order following the exposure zone as viewed in the rotating direction B of the drum 250. The two coating means 256, 258 include feeders 264, 266 for feeding the developer material 260 and the microcapsules 62, respectively. Each of the microcapsules 262 contains a radiation-curable resin which is cured upon exposure to light or radiation, a chromogenic material or color precursor, a polymerization initiator, etc. Meanwhile, the developer material 260 is opaque, and chemically reacts with the chromogenic material coming out of each microcapsule, thereby developed a color. The microcapsules 262 include three kinds of capsules corresponding to three kinds of colors. Therefore the color images on the color-image original 32 can be reproduced, that is, a color copy thereof can be produced. More specifically, the microcapsules 262 includes capsules C which are cured upon exposure to red light, capsules M which are cured upon exposure to green light, and capsules Y which are cured upon exposure to blue light. A degree of hardness of each capsule C, M, Y is changed upon exposure to light depending upon the color and intensity of the light. Therefore, if a copy sheet 274 having thereon the microcapsules 262 is image-wise exposed according to the source image information or color images of the original 232, microcapsule-based latent images corresponding to the original color images are formed on the copy sheet. Upon application of a pressure to the copy sheet 274, the image-wise exposed capsules C, M, Y are ruptured, or not ruptured, depending upon the changed degrees of hardness thereof so that the microcapsule-based latent images are developed into color images on the copy sheet 274. These color images have the same colors and tones as those of the corresponding color images on the original 232. The developer-material and microcapsules feeders 264, 266 have rollers 268, 270, respectively, each of which is rotatable counterclockwise about an axis parallel to the rotation axis 253 of the drum 250. The developer material 260 and the microcapsules 262 are applied to the drum 250 as the rollers 268, 270 are rotated, respectively. The coating materials 260, 262 are charged by a charger (not shown) with a sign (positive or negative) opposite to a sign (negative or positive) of the drum 251. Each material 260, 262 is adhered to the drum 251 by electrostatic attraction or Coulomb's attraction according to the electrostatic latent images. Thus, the developer-material images and the microcapsules images are formed on the drum surface 251.

A corotron 272 is disposed adjacent to the drum surface 251 facing the bottom of the drum 250. The corotron 272 serves as means for transferring the developer-material images and the microcapsules images from the drum 250 to the copy sheet 274. The corotron 272 electrically charges the copy sheet 274 with a sign opposite to the sign of the developer material and microcapsules 260, 262. This permits the developer material 74 and the microcapsules 76 to be easily transferred from the drum 250 to the copy sheet 274. Thus, each material 260, 262 is applied to the copy sheet 294 according to the source image information or images on the original 232. A discharger 278 is disposed adjacent to the drum surface 251 at a location between the transfer position (or the corotron 272) and the corotron 254. The discharger 278 entirely discharges the drum surface 251.

The sheet feeding device 214 for feeding the copy sheet 274, is provided at the right-hand bottom of the housing 224 as viewed in FIG. 3. A recording medium in the form of an ordinary cut sheet is used as the copy sheet 274. The sheet feeding device 214 includes a case 280 for storing a stack of copy sheets, and a feed roller 282 for feeding the copy sheets 274 one by one out of the case 280. The copy sheet 274 fed out of the case 280 is subsequently conveyed by a pair of rollers 284, 284 and two pairs of guides 286, 286 and 288, 288 to the transfer position between the drum 250 and the corotron 272. The pair of rollers 284, 284 are rotated by a drive motor 290 (see FIG. 4) at a peripheral speed equal to the peripheral speed of the drum 250 and the displacement speed of the support 226.

After the transfer of the developer-material and microcapsules images from the drum 250 to the copy sheet 274, the copy sheet 274 is further fed by another pair of rollers 292, 292 and another pair of guides 294, 294 toward an exposing position where the copy sheet 274 having thereon the microcapsules images is image-wise exposed by the exposing device 216 according to the source image information or color images of the original 232, so that microcapsule-based latent images are formed on the copy sheet 274. The exposing position is located on the downstream side of the partition wall 248 as viewed in the copying direction. After the formation of the microcapsule-based latent images, the copy sheet 274 is further fed by a pair of rollers 296, 296 and a pair of guides 297, 297 to the developing device 218. The developing device 218 includes a pair of presser rollers 298, 300 which provide a nip for applying a pressure to the copy sheet 274 as the copy sheet 274 is fed therebetween. The rollers 298, 300 are rotated together with the rollers 284, 284, 292, 292, 296, 296 by the drive motor 290 at a peripheral speed equal to those of those rollers 284, 284, 292, 292, 296, 296. After the copy sheet 274 is pressed by the nip of the presser rollers 296, 300, the copy sheet 294 is fed to the fixing device 220. The fixing device 220 includes a heater 302 for heating the copy sheet 274 for fixation. Following the fixation the copy sheet 274 is fed by a pair of rollers 304, 304 and a pair of guides 306, 306 into a receiving tray 308.

Next the exposing device 216 will be described in detail. The exposing device 216 is provided on the downstream side of the partition wall 248 as viewed in the copying direction, and includes a lamp 310 serving as a light source. The lamp 310 has an elongate shape, and its longitudinal axis extends in a transverse direction perpendicular to the copying direction. The exposing device 216 also includes a screen 314 which is disposed in front of the lamp 310 and has an elongate slit 312 formed therethrough with a predetermined width. The slit 312 extends in parallel to the longitudinal axis of the lamp 310. Thus, the exposing device 216 irradiates an irradiation zone on an imaged surface of the original 232 bearing the source image information or color images. The irradiation zone has a suitable width and extends in a transverse direction perpendicularly to the copying direction. The light beams or images reflected from the original 232 are converged by a lens 316. The lens 316 laterally and vertically reverses the light beams or images reflected from the original 232.

Beneath the lens 316 is disposed a switching means 317 which is selectively placed in a first position in which the switching means 317 permits the light beams converged by the lens 316 to be incident to the copy sheet 274 having thereon the microcapsules images, and a second position in which the switching means 317 permits the light beams to be incident to the drum surface 251 through a slit 324 formed through the partition wall 248 as shown in two-dot chain line in FIG. 3. The switching means 317 includes a reflector mirror 318 which is supported by the housing 324 so as to be pivotable about an axis member 320 parallel to the rotation axis 253 of the drum 250. The axis member 320 is secured to an output shaft of a drive motor 322. The drive motor 322 drives or rotates the reflector mirror 318 between a first and a second angular position and thereby places the switching means 317 in the first and second positions, respectively. The second angular position of the reflector mirror 318 or the second position of the switching means 317 is defined by a stopper 326. Thus, the switching means 317 selectively permits the exposing device 216 to expose the drum surface 251 and the copy sheet 274. More specifically, with the switching means 317 placed in the second position the exposing device 216 image-wise exposes the drum surface 251 according to the source image information of the original 232. The uniformly charged drum surface 251 is locally discharged, and locally not discharged, upon exposure to light beams depending upon the intensities of the light beams. Thus, electrostatic latent images are formed in the drum surface 251 according to the original images. Meanwhile, while the switching means 317 is placed in the first position, the exposing device 216 image-wise exposes the copy sheet 274 having thereon the microcapsules images. As previously described, the degree of hardness of the radiation-curable resin of each capsule C, M, Y is changed upon exposure to light depending upon the color and intensity of the light. Therefore, microcapsule-based latent images are formed on the copy sheet 274 according to the original color images.

Figure 4:
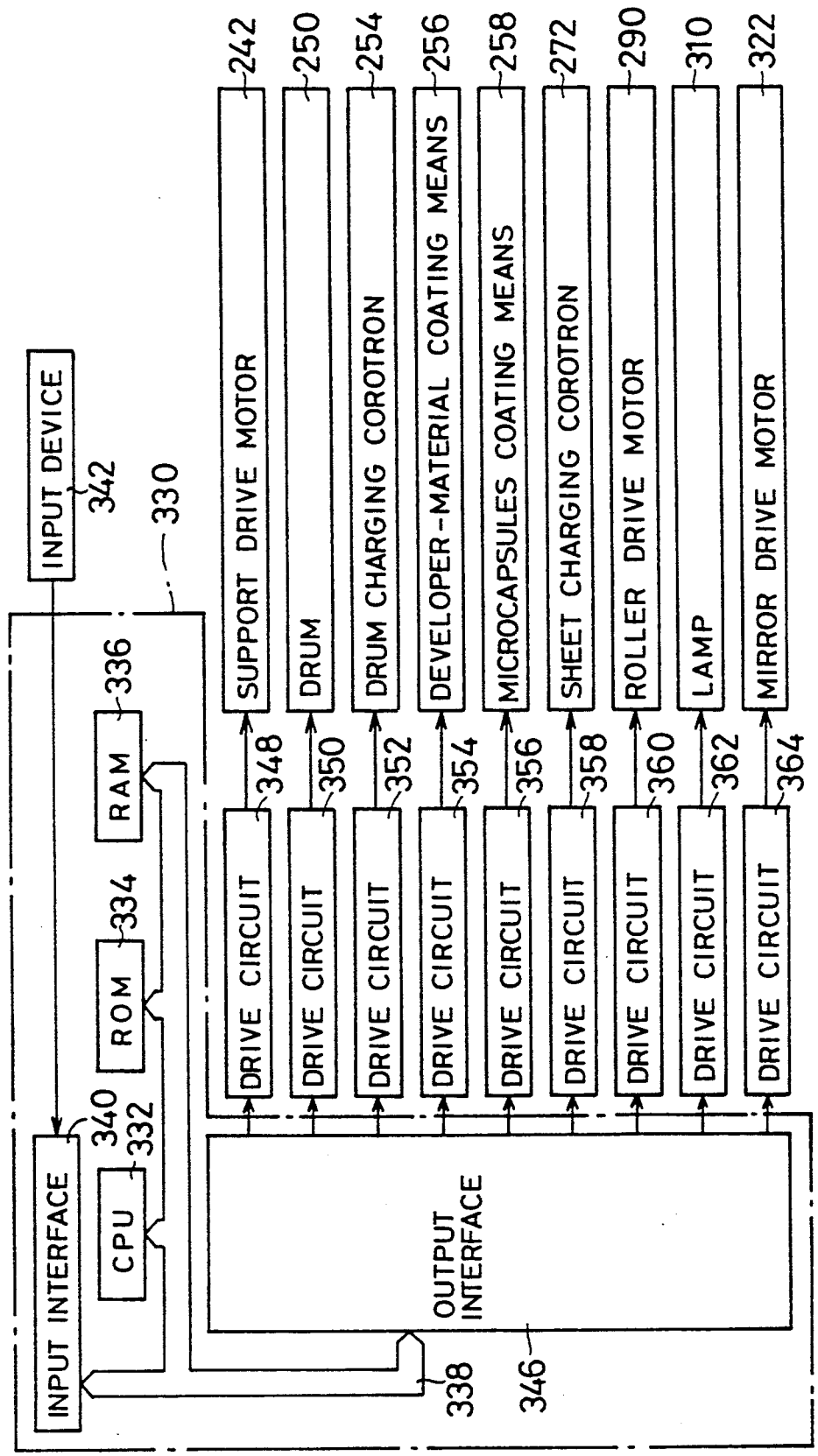
FIG. 4 is a block diagram of a control device for controlling the operation of the copying machine of FIG. 3.

In FIG. 4 there is shown a control device 330 for controlling the present copying machine. The control device 330 has a microcomputer including a central processing unit (CPU) 332, a read only memory 334 (ROM), a random access memory (RAM) 336, and data bus 338 for connection between those elements 332, 334, 336. An input interface 340 is coupled to the data bus 338, and an input device 342 is connected to the input interface 340. The input device 342 includes a start switch (not shown) for starting a copying operation, and data input keys (not shown). In addition, an output interface 346 is coupled to the data bus 338. The output interface 346 is connected to various drive circuits including (a) a drive circuit 348 for the drive motor 242 for displacing the original 232; (b) a drive circuit 350 for rotating the drum 250; (c) a drive circuit 352 for the corotron 254 for uniformly charging the drum surface 251; (d) a drive circuit 354 for the developer-material coating means 256; (e) a drive circuit 356 for the microcapsules coating means 258; (f) a drive circuit 358 for the corotron 272 for transferring the developer-material and microcapsules images from the drum 250 to the copy sheet 274; (g) a drive circuit 360 for the drive motor 290 for displacing the copy sheet 274; (h) a drive circuit 362 for the lamp 310; and (i) a drive circuit 364 for rotating the reflector mirror 322. The RAM 336 temporarily stores data entered through the input device 342, while the ROM 334 stores various control programs for operating the copying machine.

There will be described the operation of the copying machine constructed as described above.

At the start of a copying operation, the support 226 is placed at its start position so that the irradiation zone irradiated by the lamp 310 is located on the downstream-side end of the support 226 as viewed in the copying direction. In addition, the reflector mirror 318 is placed in its second position in which the reflector mirror 318 permits the lamp 310 to expose the exposure zone on the drum 250 through the slit 324 of the partition wall 248. Further, the lamp 310 is placed in a mode in which the lamp 310 generates light beams whose intensity is appropriate for the exposure of the drum surface 251. First, a color-image original 232 bearing source image information or color images is set on the support 226 and the cover 230 is put over the original 232. Upon operation of the start switch on the input device 342, the drum 250 is rotated, and the drum surface 251 is uniformly charged by the corotron 254. When the leading area of the uniformly charged portion of the drum surface 251 comes into the exposure zone, the displacement of the support 226 in the copying direction commences, and the lamp 310 irradiates the irradiation zone on the original 232 as the original 232 concurrently is displaced. The light beams or images reflected from the original 232 expose the exposure zone on the drum surface 251 as the drum 250 is rotated, thereby image-wise exposing the drum surface 251 according to the source image information on the original 232. Thus, electrostatic latent images are formed in the drum surface 251. Since the displacement speed of the support 226 and the peripheral speed of the drum 250 are equal to each other, the electrostatic latent images formed in the drum surface 251 are free from deformation or distortion as compared with the original images. This is a first exposure of the drum surface 250. At the beginning of the first exposure, the developer-material coating means 256 is placed in its operative mode while the microcapsules coating means 258 remains in its inoperative mode. The developer-material coating means 256 is operated to apply the developer material 260 to the drum surface 251 according to the electrostatic latent images, namely, the original images. Accordingly, the developer material 260 adhered to the drum surface 251 provides developer-material images corresponding to the original images.

The developer-material images on the drum surface 251 is transferred to a copy sheet 274 at the transfer position where the corotron 272 is disposed. The copy sheet 274 is fed from the case 280 to the transfer position such that, when the leading area of the exposed portion of the drum surface 251 (this area is also the leading area of the uniformly charged portion) comes to the transfer position, the downstream-side end of the copy sheet 274 as viewed in the copying direction just comes to the transfer position. Thus, the developer-material images are transferred from the drum surface 251 to the copy sheet 274 as the drum 60 and the copy sheet 90 are rotated and fed at the same speeds, respectively. After the transfer position, the exposed portion of the drum surface 251 from which portion the developer-material images have been transferred to the copy sheet 274, is discharged by the discharger 278. Unless the drum surface 251 is discharged, the electrostatic latent images formed by the first exposure remains in the drum surface 251, and the drum surface 251 cannot uniformly be charged by the corotron 254 in the next charging operation. This will cause a difference between the amount of the developer material 260 adhered to the drum surface 251 and that of the microcapsules 262 adhered to the same 251.

After the electrostatic latent images have been formed in the drum surface 251 according to the whole source image information on the original 232, the support 226 is returned in the reverse direction to its start position, and the charging operation of the corotron 254 is terminated. In addition, after the developer material 260 has been applied to the drum surface 251 according to the entire electrostatic latent images and the entire developer-material images are transferred from the drum surface 251 to the copy sheet 274, the rotation of the drum 250 is stopped and the developer-material coating means 256 is placed in its inoperative position. At this point of time the upstream-side end of the copy sheet 90 as viewed in the copying direction is located at the transfer position. After the completion of transfer of the developer-material images, the drum 250 is rotated in the reverse direction, i.e., counterclockwise as viewed in FIG. 3, and the copy sheet 274 is returned in the reverse direction so that the downstream-side end of the copy sheet 274 is located at a position spaced by a small distance upstream from the transfer position. In this process the developer material 260 once transferred to the copy sheet 274 is by no means back to the drum surface 251. The drum 250 may be adapted to remain stopped while the copy sheet 274 having thereon the developer-material images is returned in the reverse direction.

After the upstream-side end of the copy sheet 274 has been returned to the above-described position on the upstream side of the transfer position, the displacement of the copy sheet 274 and the rotation of the drum 250 are stopped. Subsequently the drum 250 is re-rotated clockwise as viewed in FIG. 3, and the drum surface 251 is uniformly charged by the corotron 254. When the leading area of the charged portion of the drum surface 251 (this area is different from the leading area of the uniformly charged portion at the previous time, but may be adapted to be the same as that) comes to the exposure zone, the displacement of the support 226 in the copying direction is re-started from its start position and the drum surface 251 is image-wise exposed according to the source image information on the original 232 as the drum 250 rotated. Thus, electrostatic latent images are formed again in the drum surface 251. This is the second exposure of the drum surface 251. At the beginning of the second exposure the microcapsules coating means 258 is placed in its operative position. Thus, the microcapsules 262 are adhered to the drum surface 251 according to the electrostatic latent images. The microcapsules images formed on the drum surface 251 are free from deformation or distortion as compared with the original images. The feeding of the copy sheet 274 is conducted like at the previous time, namely such that when the leading area of the exposed portion of the drum surface 251 (this area is also the leading area of the uniformly charged portion thereof) arrives at the transfer position the downstream-side end of the copy sheet 274 just arrives at the transfer position. The microcapsules images are transferred from the drum surface 251 to the copy sheet 274 such that the microcapsules images are precisely superposed on the developer-material images which had been transferred to the copy sheet 274. Thus, the developer-material images and the microcapsules images, each corresponding to the source image information, are applied in double layers of this order to the copy sheet 274, similar to the embodiment of FIGS. 1 and 2 (see FIG. 2). After the transfer of the microcapsules images from the drum surface 251 to the copy sheet 274, the rotation of the drum 250 is stopped and the microcapsules coating means 258 is placed in its inoperative mode.

After the second exposure of the drum surface 251, the support 226 is returned in the reverse direction to its start position, and the reflector mirror 318 is switched from the second position to the first position in which the reflector mirror 318 permits the lamp 310 to expose the copy sheet 274 having thereon the microcapsules images. In addition, the lamp 310 is placed in another mode in which the lamp 310 generates light beams whose intensity is appropriate for the exposure of the microcapsules 262. The displacement of the copy sheet 274 in the copying direction is started at the time the downstream-side end of the copy sheet 274 as viewed in the copying direction comes to a position directly below the lens 316. Thus, the microcapsules images on the copy sheet 274 are exposed to the light beams or images reflected from the original 232 and converged by the lens 318. That is, the light beams or images reflected from the original 232 are incident upon the copy sheet 274 so as to image-wise expose the microcapsule images on the copy sheet 274 according to the source image information or color images on the original 232, as if the original color images were superposed on the microcapsule images without any dislocation therebetween. Thus, microcapsule-based latent images are formed on the copy sheet 274. More specifically, the degree of hardness of the radiation-curable resin of each capsule C, M, Y is changed upon exposure to light depending upon the color and intensity of the light. When the copy sheet 274 is placed under the pressure applied by the developing device 218, the individual capsules C, M, Y constituting the microcapsule-based latent images are ruptured, or not ruptured, depending upon the changed degrees of hardness thereof. The chromogenic material or color precursor coming out of each ruptured capsule chemically reacts with the developer material 260 constituting the developer-material images, so as to develop a corresponding color. Thus, color images are developed on the copy sheet 274. These color images have the same colors and tones as those of the corresponding color images on the original 232. Since the microcapsules images are superposed on the developer-material images on the copy sheet 274, the exposure of the microcapsule images are not interfered with although the developer material 260 constituting the developer-material images are opaque and does not transmit light. After the application of the developing pressure the copy sheet 274 is heated by the fixing device 220 and then is fed out into the receiving tray 308.

As clearly emerges from the foregoing, the present copying machine provides the same advantages as the first embodiment of FIGS. 1 and 2. Specifically, the copying machine permits any kind of recording medium to be used as the copy sheet 274. In addition, the copying machine applies to the copy sheet 274 the developer material 260 and the microcapsules 262 according to the source image information or images on the original 232, and therefore the amount of use of the materials 260, 274 is reduced and the cost of production per copy is lowered.

Furthermore, the present copying machine has the switching means 317 (or reflector mirror 318) which is selectively placed in the first position in which the reflector mirror 318 directs the light beams reflected from the original 232 toward the photosensitive drum 250 so as to form the electrostatic latent images, and the second position in which the reflector mirror 318 permits the reflected light beams upon be incident to the copy sheet 274 so as to form microcapsule-based latent images. Therefore, the single exposing device 216 serves to form the electrostatic latent images on the drum 250 and form the microcapsule-based latent images on the copy sheet 274. In other words, the lamp 310, lens 316, etc. of the exposing device 216 are commonly used for the above-indicated two operations or functions. Accordingly, the present copying machine is manufactured at low cost, simplified in construction and reduced in size.

Figure 5:
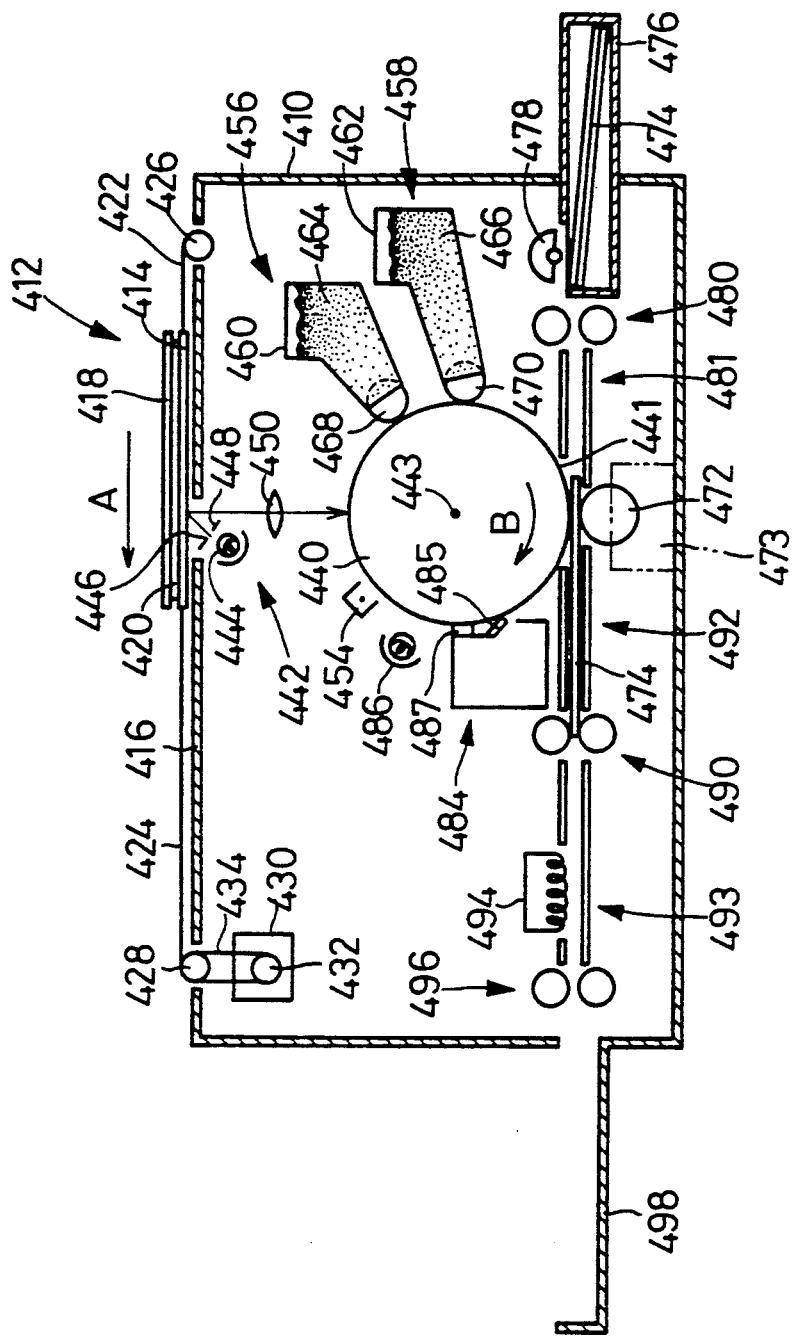
FIG. 5 is a schematic view of a third embodiment of the present invention.

Referring further to FIG. 5, there is illustrated a third embodiment of the present invention.

In the figure reference numeral 410 designates a housing of the instant copying machine. An original displacing device 412 for displacing a color-image original 420 bearing source image information or color images, is provided at the top of the housing 410. The original displacing device 412 includes a support 414 on which the original 420 is set. The support 414 is formed of a colorless transparent material, such as glass, which transmits light or radiation. The support 414 is located on a top wall 416 of the housing 410 such that the support 414 is displaceable in rightward and leftward directions as viewed in FIG. 5. The original displacing device 412 further includes a cover 418 for covering the original 420 set on the support 414. Wires 422, 424 are connected at their one end to the right-hand and left-hand ends of the support 414, respectively, and are wound at their other end around pulleys 426, 428, respectively. The pulleys 426, 428 are rotatably supported by the housing 410. The pulley 428 is located on the downstream side of the pulley 426 as viewed in the leftward direction indicated at A in FIG. 5. Hereinafter this direction "A" is referred to as the "copying" direction, and a direction opposite to the direction "A" is referred to as the "reverse" direction. The pulley 428 is coupled via a belt 434 to a pulley 428 fixed to an output shaft of a drive motor 430. The drive motor 430 drives or rotates the pulley 428 and thereby displaces the support 414 in the copying direction. Meanwhile, the pulley 426 is biased by a biasing device (not shown) to rotate in a direction causing taking-up of the wire 422 and thereby displacing the support 414 in the reverse direction. Accordingly, when the drive motor 430 is rotated in a direction opposite to the direction causing the displacement of the support 424 in the copying direction, the support 414 is returned in the reverse direction toward its start position wherein the displacement of the support 414 in the copying direction commences.

An electrostatic body in the form of a photosensitive drum 440 is provided at the middle inside the housing 410. The drum 440 is prepared by applying selenium by vapor deposition to the surfaces of a cylindrical member formed of a metallic conductor material such as aluminum or copper. The drum 440 has a photosensitivity comparable to that of microcapsules 464 (which will be described later). The drum 440 is rotated about an axis 443 clockwise as viewed in FIG. 5 at a peripheral speed equal to a speed of the displacement of the support 414. An exposing device 442 is provided directly above the drum 440. The exposing device 442 exposes an exposure zone at the top of an outer circumferential surface 441 of the drum 440. The exposure zone has a suitable with and extends in parallel to the rotation axis 443 of the drum 440. More specifically, the exposing device 442 includes a lamp 444 serving as a light source. The lamp 444 has an elongate shape, and its longitudinal axis extends in a transverse direction perpendicular to the copying direction. The exposing device 442 also includes a screen 448 which is disposed in front of the lamp 444 and has an elongate slit 446 formed therethrough with a predetermined width. The slit 446 extends in parallel to the longitudinal axis of the lamp 444. Thus, the exposing device 442 irradiates an irradiation zone on an imaged surface of the original 420 bearing the source image information or color images. Thus, the irradiation zone has a suitable width and extends in a transverse direction perpendicular to the copying direction. The light beams or images reflected from the original 420 is converged by a lens 450. The lens 450 laterally and vertically reverses the reflected light beams or images. A corotron 454 is disposed adjacent to the drum surface 441 at a location prior to the exposure zone as viewed in a rotating direction B of the drum 440. The corotron 454 uniformly electrically charges the drum surface 441. The uniformly charged drum surface 441 is image-wise exposed by the exposing device 442 according to the source image information or images on the original 420. More specifically, the uniformly charged drum surface 441 is locally discharged through the underlying conductor material, and locally not discharged, upon exposure to light beams depending upon the intensities of the light beams. Thus, electrostatic latent images are formed in the drum surface 441 according to the original images.

The coating device 412 further includes a microcapsules coating means 456 and a developer-material coating means 458 which are disposed adjacent to the drum surface 441 at respective locations of this order following the exposure zone as viewed in the rotating direction B of the drum 440. The microcapsules and developer-material coating means 456, 458 include feeders 460, 462 for feeding the microcapsules 464 and a developer material 466, respectively. Each of the microcapsules 464 contains a radiation-curable resin which is cured upon exposure to light or radiation, a chromogenic material or color precursor, a polymerization initiator, etc. Meanwhile, the developer material 466 is opaque, and chemically reacts with the chromogenic material coming out of each microcapsule, thereby develop a color. The microcapsules 464 include three kinds of capsules corresponding to three colors. Therefore a color copy of the color-image original 420 can be produced. More specifically, the microcapsules 464 includes capsules C which are cured upon exposure to red light, capsules M which are cured upon exposure to green light, and capsules Y which are cured upon exposure to blue light. A degree of hardness of each capsule C, M, Y is changed upon exposure to light depending upon the color and intensity of the light. Therefore, if a copy sheet 474 having thereon the microcapsules 464 is image-wise exposed according to the source image information or color images of the original 42, microcapsule-based latent images corresponding to the original color images are formed on the copy sheet 474. Upon application of a pressure to the copy sheet 474, the capsules C, M, Y are ruptured, or not ruptured, depending upon the changed degree of hardness thereof and the chromogenic material coming out of each ruptured capsule reacts with the developer material 466, so that the microcapsule-based latent images are developed into color images on the copy sheet 474. These color images have the same colors and tones as those of the corresponding color images on the original 420. The feeders 460, 462 have rollers 468, 470, respectively, each of which is rotatable counterclockwise as viewed in FIG. 5 about an axis parallel to the rotation axis 443 of the drum 440. The microcapsules 464 and the developer material 466 are applied to the drum 440 as the rollers 468, 470 are rotated, respectively. The coating materials 464, 466 are electrically charged by a charger (not shown) with a sign (positive or negative) opposite to a sign (negative or positive) of the drum surface 441. Each material 464, 466 is adhered to the drum surface 441 by electrostatic attraction or Coulomb's attraction according to the electrostatic latent images.

A presser roller 472 is disposed face to face with the drum surface 441 at a location diametrically opposite to the exposure zone directly below the lens 450. The presser roller 472 is rotatable about an axis parallel to the rotation axis 443 of the drum 440, and is displaceable between its first position at which the presser roller 472 is in pressed contact with the drum surface 441 and its second position at which the presser roller 472 is apart from the drum surface 441. The presser roller 472 is displaced by a pressing device 473 between the first and second positions. Thus, the presser roller 472 cooperates with the drum 440 to provide a nip for applying a pressure to the copy sheet 474 fed therebetween. A recording medium in the form of an ordinary cut sheet is used as the copy sheet, and a stack of copy sheets 474 are stored in a case 476. A roller 478 feeds the copy sheets 474 one by one out of the case 476. The copy sheet 474 fed out of the case 476 is subsequently conveyed by a pair of rollers 480, 480 and a pair of guides 481, 481 to a pressing position between the drum 440 and the presser roller 472. The pair of rollers 480, 480 are rotated by a drive motor 482 (see FIG. 7) at a peripheral speed equal to the peripheral speed of the drum 440 and the displacement speed of the support 414.

A cleaning device 484 and a discharger 486 are disposed adjacent to the drum surface 251 at respective locations of this order between the pressing position (or the presser roller 472) and the corotron 454 as viewed in the direction B. The cleaning device 484 includes a cleaning blade 485 and a cleaning pad 487. The cleaning blade 485 scrapes remaining microcapsules 464 and developer material 466 off the drum surface 441, while the cleaning pad 487 wipes the drum surface 441 clean. The discharger 486 entirely discharges the drum surface 441.

The copy sheet 474 pressed by the nip of the drum 440 and the presser roller 472, is fed by a pair of guides 492, 492, a pair of rollers 490, 490 and a pair of guides 493, 493 all of which are disposed on the downstream side of the pressing position as viewed in the copying direction. A heater 494 is supported by the upper one of the guides 493. The heater 494 heats the copy sheet 474 for fixation after the application of the pressure thereto. Following the fixation the copy sheet 474 is further fed by a pair of rollers 494, 494 into a receiving tray 308 where the operator or user takes the copy sheet 474 as a color copy of the color-image original 420. The rollers 490, 490, 496, 496 are rotated at a peripheral speed equal to the peripheral speed of the drum 440 and the displacement speed of the support 414 (or the original 420).

Figure 7:
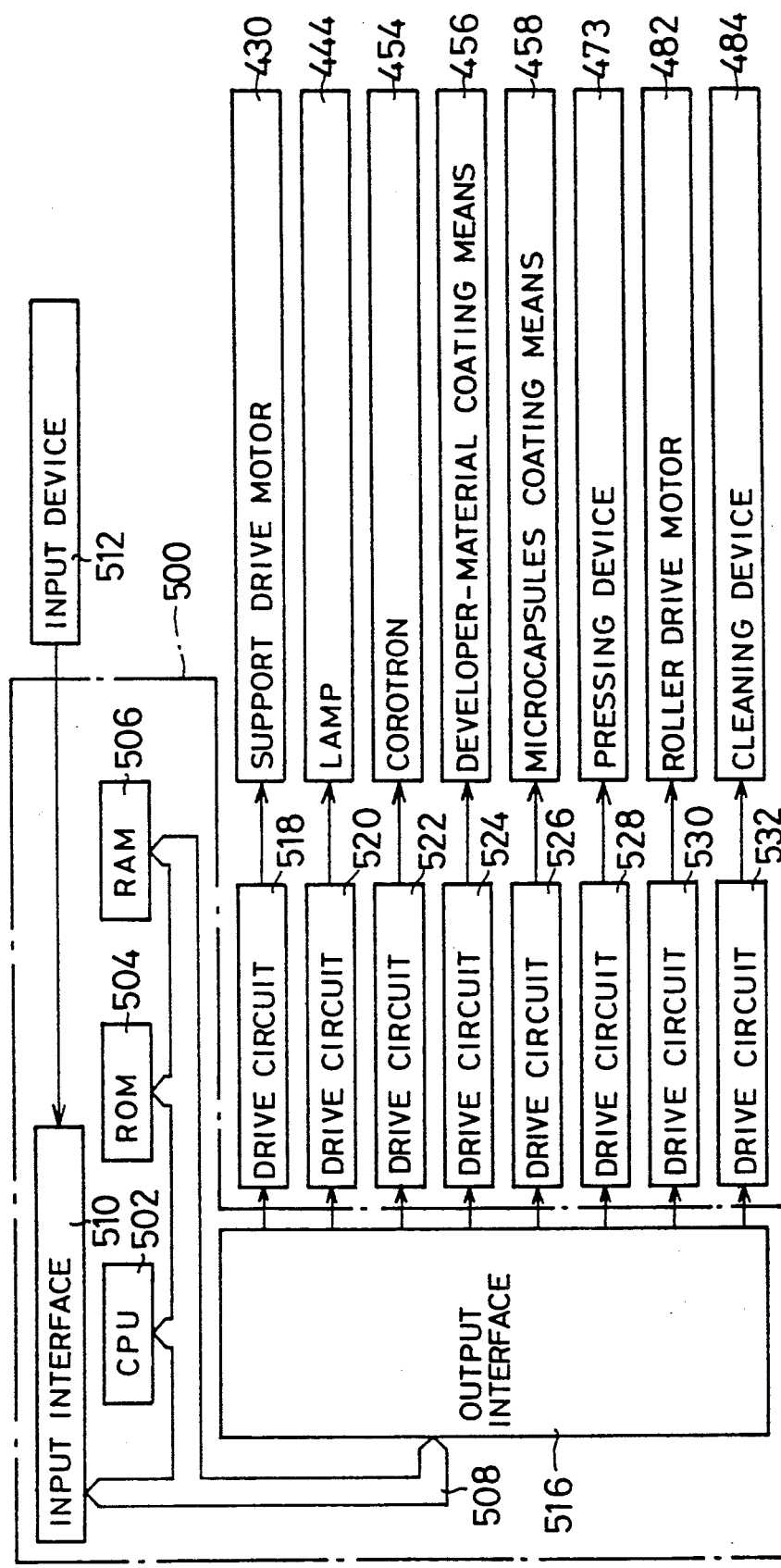
FIG. 7 is a block diagram of a control device for controlling the operation of the copying machine of FIG. 5.

In FIG. 7 there is shown a control device 500 for controlling the instant copying machine. The control device 500 has a microcomputer including a central processing unit (CPU) 502, a read only memory 504 (ROM), a random access memory (RAM) 506, and data bus 508 for connection between these elements 502, 504, 506. An input interface 510 is coupled to the data bus 508, and an input device 512 is connected to the input interface 510. The input device 512 includes a start switch (not shown) for starting a copying operation, and data input keys (not shown). In addition, an output interface 516 is coupled to the data bus 508. The output interface 516 is connected to various drive circuits including (a) a drive circuit 518 for the drive motor 430 for displacing the support 414 (original 420); (b) a drive circuit 520 for the lamp 444; (c) a drive circuit 522 for the corotron 454 for charging the drum surface 441; (d) a drive circuit 524 for the microcapsules coating means 456; (e) a drive circuit 526 for the developer-material coating means 458; (f) a drive circuit 528 for the pressing device 473; (g) a drive circuit 530 for the drive motor 482 for displacing the copy sheet 474; and (h) a drive circuit 532 for the cleaning device 484. The RAM 506 temporarily stores data entered through the input device 512, while the ROM 504 stores various control programs for operating the instant copying machine.

There will be described the operation of the copying machine constructed as described above.

At the start of a copying operation, the support 414 is placed at its start position so that the irradiation zone irradiated by the lamp 444 is located on the downstream-side end of the support 414 as viewed in the copying direction. First, a color-image original 420 bearing source image information or color images is set on the support 414 and the cover 418 is put on the original 420. Upon operation of the start switch on the input device 512, the drum 440 is rotated, and as the drum 440 is rotated the drum surface 441 is uniformly charged by the corotron 454. When the leading area of the uniformly charged portion of the drum surface 441 comes to the exposure zone, the support 414 begins to displace in the copying direction, and the lamp 444 irradiates the irradiation zone on the original 420 as the original 420 concurrently is displaced in the copying direction. The light beams or images reflected from the original 420 expose the exposure zone on the drum surface 441 as the drum is rotated, thereby image-wise exposing the drum surface 441 according to the source image information or images on the original 420. Thus, electrostatic latent images are formed in the drum surface 441. Since the displacement speed of the support 420 and the peripheral speed of the drum 440 are equal to each other, the electrostatic latent images formed in the drum surface 441 are free from deformation or distortion as compared with the original images. This is a first exposure of the drum surface 441. At the beginning of the first exposure, the microcapsules coating means 456 is placed in its operative mode, while the developer-material coating means 458 remains in its inoperative mode. The microcapsules coating means 456 is operated for applying the microcapsules 464 to the drum surface 441 according to the electrostatic latent images, namely, the original images. Accordingly, the microcapsules 464 adhered to the drum surface 441 provide the microcapsules images corresponding to the original images.

After the electrostatic latent images corresponding to the whole source image information have been formed in the drum surface 441, the support 414 is returned in the reverse direction to its start position. Further, after the microcapsules 464 have been applied to the drum surface 441 according to the entire electrostatic latent images, the microcapsules coating means 456 is placed in its inoperative position. During the first exposure the cleaning blade 485 of the cleaning device 484 remains at its second position apart from the drum surface 441. In other words, the cleaning device 484 remains in its inoperative mode. Meanwhile, the discharger 486 is operated to discharge the drum surface 441 having thereon the microcapsules images. Unless the drum surface 441 is discharged, the electrostatic latent images formed by the first exposure remains in the drum surface 441 and the drum surface 441 cannot be uniformly charged by the corotron 454 in the next charging operation. This will cause a difference between the amount of the microcapsules 464 adhered to the drum surface 441 and that of the developer material 466 adhered to the same 441. Following the discharge by the discharger 488, the drum surface 441 having thereon the microcapsules images is uniformly charged by the corotron 454.

Figure 6:
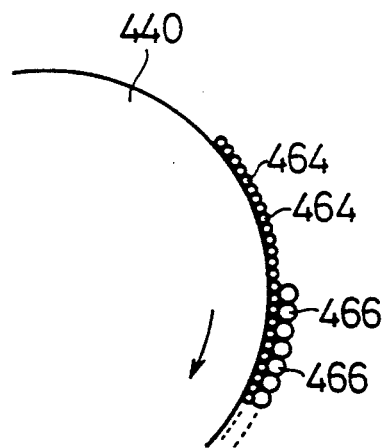
FIG. 6 is an explanatory view illustrating the microcapsules and the developer material applied in double layers to a photosensitive drum by a coating device of the copying machine of FIG. 5.

When the leading area of the uniformly charged portion of the drum surface 441 (this area is the leading area of the uniformly charged portion at the previous time) comes to the exposure zone directly below the lens 450, the displacement of the support 414 in the copying direction commences, so that the drum surface 441 is image-wise exposed according to the source image information or images on the original 420 and as a result electrostatic latent images are formed in the drum surface 441. This is a second exposure of the drum surface 441. Concurrently the microcapsules images on the drum surface 441 are image-wise exposed according to the source image information, and therefore microcapsule-based latent images are formed on the drum surface 441. More specifically, the the electrostatic latent images according to which the developer-material images are to be formed on the drum surface 441, and the microcapsule-based latent images, are simultaneously formed on the drum surface 441 by the second exposure of the drum surface 441. At the beginning of the second exposure the developer material coating means 458 is placed in the operative mode and is operated to apply the developer material 466 to the drum surface 441 according to the newly formed electrostatic latent images. In other words, the developer-material images are superposed on the microcapsules images (or microcapsule-based latent images) with precision, namely, without any dislocation therebetween. Thus, the microcapsules images and the developer-material images, each corresponding to the original images, are applied in double layers of this order to the drum surface 441 as shown in FIG. 6.

In synchronization with the second exposure of the drum surface 441, the copy sheet 474 is fed from the case 476 to the pressing position such that, when the leading area of the exposed portion of the drum surface 441 comes to the pressing position, the downstream-side end of the copy sheet 474 as viewed in the copying direction just comes to the pressing position. At the pressing position the copy sheet 474 is pressed by, and between, the drum 440 and the presser roller 472 as the copy sheet 474 is fed therebetween. As a result, the individual capsules C, M, Y constituting the microcapsule-based latent images are ruptured, or not ruptured, depending upon the degrees of hardness thereof. The chromogenic material or color precursor coming out of each ruptured capsule chemically reacts with the developer material 466 constituting the developer-material images, and thereby develops a corresponding color. The developed color (material) is adhered to, or absorbed by, the copy sheet 474 under the applied pressure. Thus, color images are formed on the copy sheet 474. These color images have the same colors and tones as those of the corresponding color images on the original 420. Meanwhile, in synchronization with the application of the developing pressure to the copy sheet 474, the cleaning device 484 is placed in its operative mode. More specifically, the cleaning blade 485 is brought into contact with the drum surface 441 so as to remove the microcapsules and developer material 464, 466 remaining on the drum surface 441 after the pressing operation for developing the microcapsule-based latent images into the visible color images on the copy sheet 474. After the development the copy sheet 474 is further fed in the copying direction, subsequently heated by the heater 494 for fixation of the color images, and then fed into the receiving tray 498 where the operator or user takes the copy sheet 474 as a color copy of the color-image original 420.

As is apparent from the foregoing, the instant copying machine provides the same advantages as the preceding two embodiments. Specifically, the copying machine permits any kind of recording medium to be used as the copy sheet 474. In addition, since the copying machine applies to the copy sheet 474 the microcapsules 464 and the developer material 466 according to the source image information or images on the original 420, the amount of use of each material 464, 466 is reduced and accordingly the cost of production per copy is lowered.

Furthermore, the instant copying machine has the same advantage as the second embodiment of FIGS. 3 and 4 in that the copying machine uses the single exposing device (442). The exposing device 442 serves to image-wise expose the microcapsules images on the drum surface 441 according to the source image information to form the microcapsule-based latent images, as well as image-wise expose the drum surface 441 according to the source image information to form the electrostatic latent images. Accordingly, the instant copying machine is manufactured at low cost, simplified in construction and reduced in size.

In addition, in the illustrated embodiment, the electrostatic latent images according to which the developer material 466 is applied to the drum surface 441 to form the developer-material images, are formed by the second exposure of the drum surface 441 simultaneously with the formation of the microcapsule-based latent images. Accordingly, the number of the displacements of the support 414 in the copying direction is reduced from the three times required in the second embodiment of FIGS. 3 and 4, to two times.

Moreover, in the illustrated embodiment, the photosensitive drum 440 serving as the electrostatic body for forming thereon the electrostatic latent images, cooperates with the presser roller 472 to apply the developing pressure to the copy sheet 474 having thereon the microcapsule-based latent images. Accordingly the construction of the instant copying machine is simplified as compared with the second embodiment of FIGS. 3 and 4 in which the developer-material images and the microcapsules images are transferred from the drum to the copying sheet and then the copy sheet having thereon the microcapsule-based latent images are subjected to the developing pressure.

While the present invention has been described in its presently preferred embodiments with a certain degree of particularity, it is to be understood that the invention is not limited to the precise details of the illustrated embodiments, but may be embodied with various changes, modifications and improvements, which may occur to those skilled in the art, without departing from the scope and spirit of the invention defined in the appended claims.

What is claimed is:

1. A recording system for recording visible images on a recording medium according to source image information, comprising:

a coating device for applying to said recording medium a first coating material including microcapsules each of which contains a chromogenic material and a photosensitive material whose hardness is chargeable upon exposure to a radiation, and a second coating material including a developer material, said coating device applying at least one of said first and second coating materials to said recording medium according to said source image information;

an exposing device for image-wise exposing said recording medium having thereon said first coating material, to a radiation having said source image information, so as to change degrees of hardness of said microcapsules according to said source image information and thereby form on said recording medium microcapsule-based latent images representing said source image information;

a developing device for applying a pressure to the image-wise exposed recording medium so as to rupture said microcapsules depending upon the degrees of hardness thereof, and thereby cause a chemical reaction of the chromogenic material coming out of the ruptured microcapsules with said developer material, whereby said microcapsule-based latent images are developed into said visible images on said recording medium; and a control device controlling said exposing device, said coating device and said developing device such that at least one of the first and second coating materials is image-wise applied to said recording medium according to said source image information, and subsequently said first coating material on said recording medium is image-wise exposed to said radiation to form microcapsule-based latent images on said recording medium according to said source image information, and then said microcapsule-based latent images are developed into said visible images.

2. The recording system as set forth in claim 1, wherein said coating device includes
an electrostatic body having an electrostatically chargeable surface, said electrostatically chargeable surface permitting electrostatic latent images to be formed therein according to said source image information,
coating means for applying said at least one of said first and second coating materials to said electrostatically chargeable surface of said electrostatic body according to said electrostatic latent images, and
transferring means for transferring said at least one coating material from said electrostatically chargeable surface to said recording medium.

3. A recording system for recording visible images on a recording medium according to source image information, comprising:
an image-wise coating device for applying to said recording medium a first coating material including microcapsules each of which contains a chromogenic material and a photosensitive material whose hardness is changeable upon exposure to a radiation, and a second coating material including a developer material, said coating device applying at least one of said first and second coating materials to said recording medium according to said source image information, said coating device including:
an electrostatic body having an electrostatically chargeable surface, said electrostatically chargeable surface permitting electrostatic latent images to be formed therein according to said source image information,
coating means for applying said at least one of said first and second coating materials to said electrostatically chargeable surface of said electrostatic body according to said electrostatic latent images, and
transferring means for transferring said at least one coating material from said electrostatically chargeable surface to said recording medium;
the recording system further comprising:
a first image-wise exposing device for image-wise exposing said recording medium having thereon said first coating material, to a radiation having said source image information, so as to change degrees of hardness of said microcapsules according to said source image information and thereby form on said recording medium microcapsule-based latent images representing said source image information; and
a developing device for applying a pressure to the image-wise exposed recording medium so as to rupture said microcapsules depending upon the degrees of hardness thereof, and thereby cause a chemical reaction of the chromogenic material coming out of the ruptured microcapsules with said developer material, whereby said microcapsule-based latent images are ddveloped into said visible images on said recording medium;
wherein said coating device further includes;
a charging device for uniformly charging said electrostatically chargeable surface of said electrostatic body, and
a second exposing device for exposing the uniformly charged surface of said electrostatic body to said radiation having said source image information, so as to form therein said electrostatic latent images.

4. The recording system as set forth in claim 3, wherein said electrostatic body consists of a drum which is rotatable about an axis, said second exposing device exposing to said radiation an exposure zone extending with a predetermined width in parallel to said axis on an electrostatically chargeable circumferential surface of said drum as said drum is rotated about said axis, so that said electrostatic latent images are formed in said circumferential surface of said drum.

5. The recording system as set forth in claim 3, wherein said coating means of said coating device includes
a first coating means for applying said first coating material to said electrostatic body according to said electrostatic latent images, and
a second coating means for applying said second coating material to said electrostatic body according to said electrostatic latent images,
said coating device further including
control means for controlling said electrostatic body, said first and second coating means, and said transferring means such that said second coating material is first applied to said electrostatic body, and is then transferred from said electrostatic body to said recording medium, said first coating material being subsequently applied to said electrostatic body, and then transferred from said electrostatic body to said recording medium.

6. The recording system as set forth in claim 3, wherein said first and second exposing devices include a common light source.

7. The recording system as set forth in claim 6, wherein said first and second exposing devices include displacing means for displacing an image original bearing said source image information, as said original is displaced by said displacing means said common light source irradiating an irradiation zone on said original, said irradiation zone extending with a predetermined width perpendicularly to a direction of the displacement of said original, said first and second exposing devices further including switching means which is selectively placed in a first position thereof in which said switching means permits the exposure of said recording medium to said radiation, and in a second position thereof in which said switching means permits the exposure of said electrostatic body to said radiation.

8. The recording system as set forth in claim 1, wherein said microcapsules include plural sorts of capsules corresponding to a plurality of colors, said visible images being recorded in said colors on said recording medium.

9. A recording system for recording visible images on a recording medium according to source image information, including a coating device for applying to said recording medium at least one kind of image-recording toner including a photosensitive toner, and an exposing device for image-wise exposing said recording medium having thereon said photosensitive toner, to a radiation having said source image information, so as to form on the recording to medium microcapsule-based latent images representing said source image information, wherein the improvement comprises:

said coating device includes an electrostatic body having an electrically chargeable surface, charging means for uniformly charging said electrically chargeable surface of said electrostatic body, switching means which is selectively placed in a first position in which said switching means permits the exposure of said recording medium to said radiation, and in a second position thereof in which said switching means permits exposure to said radiation of the uniformly charged surface of said electrostatic body, for forming therein electrostatic latent images representing said source image information, coating means for applying to said electrostatic body at least one of said at least one kind of image-recording toner according to said electrostatic latent images, and transferring means for transferring said at least one of said at least one kind of image-recording toner from said electrostatic body to said recording medium.

10. The recording system as set forth in claim 9, wherein said at least one kind of image-recording toner comprise a first toner consisting of microcapsules each of which contains a chromogenic material and a photosensitive material whose hardness is changeable upon exposure to a radiation, and a second toner consisting of a developer material, said exposing device for exposing to said radiation said recording medium having thereon said first toner, so as to change degrees of hardness of said microcapsules according to said source image information and thereby form on said recording medium microcapsule-based latent images representing said source image information, the recording system further comprising a developing device for applying a pressure to the image-wise exposed recording medium so as to rupture said microcapsules depending upon the degrees of hardness thereof, and thereby cause a chemical reaction of the chromogenic material coming out of the ruptured microcapsules with said developer material, so that said microcapsule-based latent images are developed into said visible images on said recording medium.

11. The recording system as set forth in claim 10, wherein said switching means includes a reflector mirror which is rotatable about an axis, a drive means for rotating said reflector mirror about said axis between a first and a second angular position thereof, and thereby selectively place said switching means in said first and second positions thereof, respectively.

12. The recording system as set forth in claim 10, wherein said exposing device includes displacing means for displacing an image original bearing said source image information, and a light source for irradiating an irradiation zone on said original which is being displaced by said displacing means, said irradiation zone extending with a predetermined width perpendicularly to a direction of the displacement of said original, said switching means for selectively directing the light reflected by said original toward said recording medium having thereon said first toner and said electrostatic body.

13. A recording system for recording visible images on a recording medium according to source image information, comprising:

an electrostatic body having an electrostatically chargeable surface;

an image-wise exposing device for image-wise exposing the electrostatically chargeable surface of said electrostatic body, to a radiation having said source image information, so as to form on said electrostatic body electrostatic latent images representing said source image information;

a first coating device for image-wise applying to the electrostatically chargeable surface of said electrostatic body a first coating material including microcapsules each of which contains a chromogenic material and a photosensitive material whose hardness is changeable upon exposure to radiation, according to said electrostatic latent images;

said image-wise exposing device, after image-wise exposing the electrostatically chargeable surface of said electrostatic body, further exposing said first coating material image-wise applied according to said electrostatic latent images, to said radiation, so as to change degrees of hardness of said microcapsules according to said source image information and thereby form on said electrostatic body microcapsule-based latent images representing said source image information;

a developing device for applying a pressure to said microcapsule-based latent images on said recording medium so as to rupture said microcapsules depending upon the degrees of hardness thereof, and thereby cause a chemical reaction of the chromogenic material coming out of the ruptured microcapsules with a developer material, whereby said microcapsule-based latent images are developed into said visible images on said recording medium; and a control device for controlling said image-wise exposing device, said first coating device and said developing device, such that said at least one of said first and second coating materials is image-wise applied to the electrostatically chargeable surface of said electrostatic body according to said electrostatic latent images, and subsequently said electrostatic body having thereon said first coating material is image-wise exposed to said radiation so as to form said microcapsule-based latent images according to said source image information, and then said microcapsule-based latent images are developed into said visible images.

14. A recording system for recording visible images on a recording medium according to source image information, comprising:

an electrostatic body having an electrostatically chargeable surface;

a charging device for uniformly charging said electrostatically chargeable surface of said electrostatic body;

an exposing device for image-wise exposing the uniformly charges surface of said electrostatic body, to a radiation having said source image information, so as to form on said electrostatic body electrostatic latent images representing said source image information;

a coating device for applying to said electrostatic body a coating material including microcapsules each of which contains a chromogenic material and a photosensitive material whose hardness is changeable upon exposure to a radiation, according to said electrostatic latent images;

said exposing device image-wise exposing said electrostatic body having thereon said coating material applied according to said electrostatic latent images, to said radiation, so as to change degrees of hardness of said microcapsules according to said source image information and thereby form on said electrostatic body microcapsule-based latent images representing said source image information; and a developing device including a presser member which cooperates with said electrostatic body, for applying a pressure to said microcapsule-based latent images on said recording medium so as to rupture said microcapsule depending upon the degrees of hardness thereof, and thereby cause a chemical reaction of the chromogenic material coming out of the ruptured microcapsules with a developer material, whereby said microcapsule-based latent images are developed into said visible images on said recording medium; and a control device for controlling said exposing device, said coating device and said developing device, such that said coating material is first applied to said electrostatic body according to said electrostatic latent images, and said electrostatic body having thereon said coating material is subsequently exposed to said radiation so as to form said microcapsule-based latent images, said microcapsule-based latent images being then developed into said visible images.

15. A recording system according to claim 13, further comprising a charging device for uniformly charging said electrostatically chargeable surface of said electrostatic body, said exposing device image-wise exposing the uniformly charged surface of said electrostatic body to said radiation having said source image information.

16. A recording system according to claim 13, further comprising a second coating device, different from said first coating device which image-wise applies to said electrostatic body said first coating material including said microcapsules, said second coating device image-wise applying to said first coating material a second coating material according to said source image information, said second coating material including a developer material which is capable of chemically reacting with said chromogenic material of said microcapsules of said first coating material.

17. A recording system according to claim 16, wherein said control device controls said image-wise exposing device and said first and second coating devices, such that said image-wise exposing device is operated to image-wise expose said first coating material applied by said first coating device so as to form said microcapsule-based latent images according to said source image information, and concurrently image-wise expose said electrostatic body so that said second coating material applied by said second coating device is superposed on said microcapsule-based latent images, according to said source image information.

18. A recording system according to claim 14, further comprising, in addition to said coating device as a first coating device, a second coating device for applying, in addition to said coating material as a first coating material applied by said first coating device, a second coating material including said developer material to said electrostatic body according to said source image information.

19. A recording system according to claim 18, wherein said control device further controls said second coating device such that, simultaneously with the formation of said microcapsule-based latent images on said electrostatic body, electrostatic latent images are formed on said electrostatic body according to said source image information, said second coating material being subsequently applied to said electrostatic body according to the thus formed electrostatic latent images, and said microcapsule-based latent images being then developed into said visible images.

* * * * *